United States Patent
Fukunaga et al.

(10) Patent No.: US 11,541,461 B2
(45) Date of Patent: Jan. 3, 2023

(54) COATED CUTTING TOOL, AND METHOD AND SYSTEM FOR MANUFACTURING THE SAME BY CHEMICAL VAPOR DEPOSITION

(71) Applicant: MOLDINO Tool Engineering, Ltd., Tokyo (JP)

(72) Inventors: Yuuzoh Fukunaga, Yasu (JP); Masayuki Imai, Narita (JP)

(73) Assignee: MOLDINO Tool Engineering, Ltd., Tokyo (JP)

( * ) Notice: Subject to any disclaimer, the term of this patent is extended or adjusted under 35 U.S.C. 154(b) by 429 days.

(21) Appl. No.: 16/639,901

(22) PCT Filed: Nov. 9, 2018

(86) PCT No.: PCT/JP2018/041620
§ 371 (c)(1),
(2) Date: Feb. 18, 2020

(87) PCT Pub. No.: WO2019/098130
PCT Pub. Date: May 23, 2019

(65) Prior Publication Data
US 2021/0354204 A1   Nov. 18, 2021

(30) Foreign Application Priority Data
Nov. 16, 2017   (JP) .............................. JP2017-221016

(51) Int. Cl.
*B23B 27/14* (2006.01)
*C23C 16/02* (2006.01)
(Continued)

(52) U.S. Cl.
CPC ........ *B23B 27/148* (2013.01); *C23C 16/0272* (2013.01); *C23C 16/34* (2013.01);
(Continued)

(58) Field of Classification Search
CPC ......... B23B 27/14; B23B 27/148; B23C 5/16; C23C 16/34
(Continued)

(56) References Cited

U.S. PATENT DOCUMENTS

2009/0170415 A1 * 7/2009 Tomita ................ C23C 30/005
451/540
2010/0263503 A1 * 10/2010 Fontaine ................ C08J 7/0427
204/192.15
(Continued)

FOREIGN PATENT DOCUMENTS

EP       2940181 A1     11/2015
JP   2003-266212 A      9/2003
(Continued)

OTHER PUBLICATIONS

International Search Report dated Feb. 5, 2019, issued for PCT/JP2018/041620.
(Continued)

*Primary Examiner* — Archene A Turner
(74) *Attorney, Agent, or Firm* — Locke Lord LLP

(57) ABSTRACT

A coated cutting tool includes a substrate and a hard film on coated on the substrate. The hard film contains a complex nitride of Al and Cr. The hard film includes aggregates of columnar grains grown on the substrate along the thickness of the film. The nitride has an Al content of 60 atom % or more, a Cr content of 10 atom % or more, and a total content of Al and Cr of 90 atom % or more relative to the total amount of metal and metalloid elements. The complex nitride has the highest peak intensity assigned to crystal plane (311) of an fcc structure in X-ray diffractometry. In the hard film, the ratio of an X-ray diffraction intensity of plane (311) to the intensities of the other planes is 1.30 or more.

(Continued)

A method and a system are also provided for manufacturing the coated cutting tool by chemical vapor deposition.

10 Claims, 26 Drawing Sheets

(51) Int. Cl.
    *C23C 16/34*     (2006.01)
    *C23C 16/455*     (2006.01)
    *C23C 16/56*     (2006.01)

(52) U.S. Cl.
    CPC ............ *C23C 16/45512* (2013.01); *C23C 16/45561* (2013.01); *C23C 16/45574* (2013.01); *C23C 16/56* (2013.01); *B23B 2228/10* (2013.01)

(58) Field of Classification Search
    USPC ........................................................ 428/698
    See application file for complete search history.

(56) References Cited

U.S. PATENT DOCUMENTS

| | | |
|---|---|---|
| 2015/0345013 A1 | 12/2015 | Paseuth et al. |
| 2018/0071831 A1 | 3/2018 | Tanaka |
| 2018/0305811 A1 | 10/2018 | Fukunaga et al. |
| 2018/0311742 A1 | 11/2018 | Tatsuoka et al. |
| 2018/0311745 A1 | 11/2018 | Tatsuoka et al. |
| 2020/0040462 A1 | 2/2020 | Paseuth et al. |

FOREIGN PATENT DOCUMENTS

| | | |
|---|---|---|
| JP | 2007-168032 A | 7/2007 |
| JP | 2010-012564 A | 1/2010 |
| JP | 2013-116551 A | 6/2013 |
| JP | 2014-198362 A | 10/2014 |
| JP | 2017-080882 A | 5/2017 |
| JP | 2017-80883 A | 5/2017 |
| NO | 2017/090540 A1 | 6/2017 |
| WO | 2016/158717 A1 | 10/2016 |
| WO | 2017/073787 A1 | 5/2017 |

OTHER PUBLICATIONS

Office Action dated May 20, 2021, issued for Japanese Patent Application No. 2019-191969 and English translation thereof.

Lin, Jianliang et al., "The structure, oxidation resistance, mechanical and tribological properties of CrTiAlN coatings", Surface & Coatings Technology, Elsevier, vol. 277, Sep. 1, 2015, pp. 58-66. (cited in the Jul. 27, 2021 Search Report issued for EP18879901.9).

Anongsack Paseuth et al., "Deposition and analysis of Al-rich c-AlxTi1-xN coating with preferred orientation," Journal of the American Ceramic Society, vol. 100. No. 1, Oct. 6, 2016, pp. 343-353. (cited in the Jul. 27, 2021 Search Report issued for EP18879901.9).

Supplementary European Search Report dated Jul. 27, 2021, issued for European Patent Application No. 18879901.9.

* cited by examiner

COATED CUTTING TOOL, AND METHOD AND SYSTEM FOR MANUFACTURING THE SAME BY CHEMICAL VAPOR DEPOSITION

TECHNICAL FIELD

The present invention relates to a cutting tool coated with a hard film that includes a complex nitride of Al and Cr and is formed by chemical vapor deposition, a method of manufacturing the cutting tool, and a chemical vapor deposition system.

BACKGROUND ART

In order to extend the lifetimes, traditional cutting tools are coated with hard films formed by physical or chemical vapor deposition. Among such hard films, those including a complex nitride of Al and Ti and those including a complex nitride of Al and Cr have high wear resistance and high thermal resistance and have been widely used in cutting tools.

The hard films including a complex nitride of Al and Ti are generally formed on commercially available cutting tools by physical or chemical vapor deposition. In contrast, the hard films including a complex nitride of Al and Cr are formed on commercially available cutting tools by only physical vapor deposition, but not by chemical vapor deposition.

Formation of hard films by chemical vapor deposition, however, has been studied. For example, Patent Literature 1 discloses separate supply of a gas group A consisting of $NH_3$, $N_2$, and $H_2$ and a gas group B consisting of $CrCl_3$, $AlCl_3$, $Al(CH_3)_3$, $N_2$, and $H_2$ to coat the substrate of a cutting tool with a hard film including a complex nitride of Al and Cr and having a cubic structure.

CITATION LIST

Patent Literature

[PLT 1] Japanese Unexamined Patent Application Publication No. 2017-80883

SUMMARY OF INVENTION

Technical Problem

The present inventors have examined the coating disclosed in Patent Literature 1 and have found the following facts: In the case of formation of a hard film including a complex nitride of Al and Cr by chemical vapor deposition, gaseous alkaline $NH_3$ excessively reacts with halide gases, such as gaseous $CrCl_3$ and $AlCl_3$, resulting in unstable formation of films. The inventors also have found that a cutting tool coated with such a film does not have a predetermined plane orientation and thus does not have sufficient durability.

In conclusion, an object of the present invention is to provide a cutting tool coated with a complex nitride of Al and Cr and exhibiting high durability, a method of manufacturing a cutting tool coated with such a complex nitride, and a chemical vapor deposition system.

Solution to Problem

A coated cutting tool according to one embodiment of the present invention comprises a substrate and a hard film coated on the substrate; wherein the hard film comprises aggregates of columnar grains grown on the substrate along the thickness of the film, the hard film comprises a complex nitride of Al and Cr, the nitride having an Al content of 60 atom % or more and 90 atom % or less, a Cr content of 10 atom % or more, and a total content of Al and Cr of 90 atom % or more relative to the total amount of metal and metalloid elements;

the complex nitride in the hard film primarily has an fcc structure, one of nine peaks assigned to crystal planes (111), (200), (220), (311), (222), (400), (331), (420), and (422) of the fcc structure exhibiting the highest intensity in X-ray diffractometry, and the hard film having a ratio TC (311) of an X-ray diffraction intensity of 1.30 or more, wherein the ratio TC (311) is determined by an expression:

TC (311)={I(311)/Io(311)}/[Σ{(I(hkl)/Io(hkl)}/8]

wherein

I(hkl) is an observed X-ray diffraction intensity assigned to each crystal plane (hkl) of the complex nitride, Io(hkl) is the standard X-ray diffraction intensity assigned to the corresponding crystal plane (hkl) of the aluminum nitride listed in File No. 00-025-1495 available from International Center for Diffraction Data (ICDD), Σ represents the sum of the observed X-ray diffraction intensities assigned to the following eight crystal planes, and (hkl) represents the crystal planes (111), (200), (220), (311), (222), (400), (331), and (420).

The cutting tool of the embodiment preferably satisfies at least one of the following conditions:

(1) The ratio TC (311) of the X-ray diffraction intensity is 2.00 or more;

(2) The ratio TC (311) of the X-ray diffraction intensity is higher than ratios TC (hkl) of the X-ray diffraction intensities assigned to crystal planes (111), (200), (220), (222), (400), (331), and (420);

(3) The ratios TC (420) and (200) of the X-ray diffraction intensities are each 1.00 or less;

(4) The hard film satisfies a ratio TB/TA of 0.050 or more in the X-ray diffractometry, where TA represents the total peak intensity assigned to the crystal planes of the fcc structure and TB represents the peak intensity assigned to crystal plane (422);

(5) The columnar grains each have an average width of 0.1 μm or more and 2.0 μm or less at 0.5 μm from the surface of the hard film;

(6) The hard film contains dispersed crystal grains in a micro structure observed by transmission electron microscopy, the crystal grains each having a monolayer structure with a relatively high Al content and a multilayer structure with a relatively low Al content;

(7) An intermediate film is provided between the substrate and the hard film; and (8) An upper layer is provided on the hard film.

One embodiment of the present invention includes a method of manufacturing a cutting tool comprising a substrate and a hard film comprising a complex nitride of Al and Cr. The hard film coates the substrate by a chemical vapor deposition process comprises the steps of:

A) heating a chemical vapor deposition system accommodating the substrate to a temperature of 750° C. or more and 850° C. or less;

B) feeding a gas containing HCl and $H_2$ into the system and reacting metallic chromium with HCl and gasfying the resulting chromium chloride in a gas preheating chamber in the system to generate a mixed gas a1 containing chromium chloride;

C) feeding a mixed gas a2 containing $AlCl_3$ and $H_2$ into the gas preheating chamber and mixing the gas a1 with the gas a2 to generate a mixed gas A D) feeding the mixed gas A at a temperature TeA from a first nozzle into a reaction container in the system; and E) feeding a gas B containing $NH_3$, $N_2$, and $H_2$ at a temperature TeB from a second nozzle into the gas preheating chamber and feeding the gas B into the reaction container, thereby mixing the gas A with the gas B in the reaction container, wherein a ratio 2/b1 is 0.002 or more and 0.020 or less, where b1 represents the total volume % of $N_2$ and $H_2$ in the gas B and b2 represents the volume % of $NH_3$ in the gas B; and the temperature TeA is higher than the temperature TeB.

A chemical vapor deposition system according to one embodiment of the present invention comprises a gas preheating chamber, a gas discharger, and a reaction container. The gas discharger feeds a mixed gas A and mixed gas B into the reaction container.

The gas preheating chamber comprises:

(1) a gas generator bringing a mixed gas containing HCl and $H_2$ into contact with a metallic chromium for generation of gaseous chromium chloride into contact with a metallic chromium to generate a mixed gas a1 containing the chromium chloride;

(2) a first preheater preheating a mixed gas a2 containing $AlCl_3$ and $H_2$;

(3) a second preheater preheating the mixed gas B containing $NH_3$, $N_2$ and $H_2$; and (4) a mixer mixing the gas a1 with the gas a2 to generate the mixed gas A, wherein the total length of a flow path for generation of the gas a1 and a flow path for generation of the gas a2 is at least three times the length of a flow path for generation of the gas B, the flow paths for generation of the mixed gases a1 and a2 and the flow path for generation of the mixed gas B extending from inlets of the system to outlets of the gas preheating chamber; and the gas generator and the first preheater are disposed adjacent to a heater disposed in a peripheral wall of the system and the second preheater is disposed remote from the heater; and the gas discharger includes a first pipe having nozzles for feeding of the gas A into the reaction container and at least one second pipe having a nozzle for feeding of the gas B into the reaction container, the second pipe being disposed outwardly from the first pipe, the second pipe being turnable around the axis of the first pipe.

Advantageous Effects

The embodiments described above can provide a cutting tool coated with a complex nitride of Al and Cr and exhibiting high durability, a method of manufacturing a cutting tool coated with such a complex nitride, and a chemical vapor deposition system.

DESCRIPTION OF EMBODIMENTS

Figure 1A:
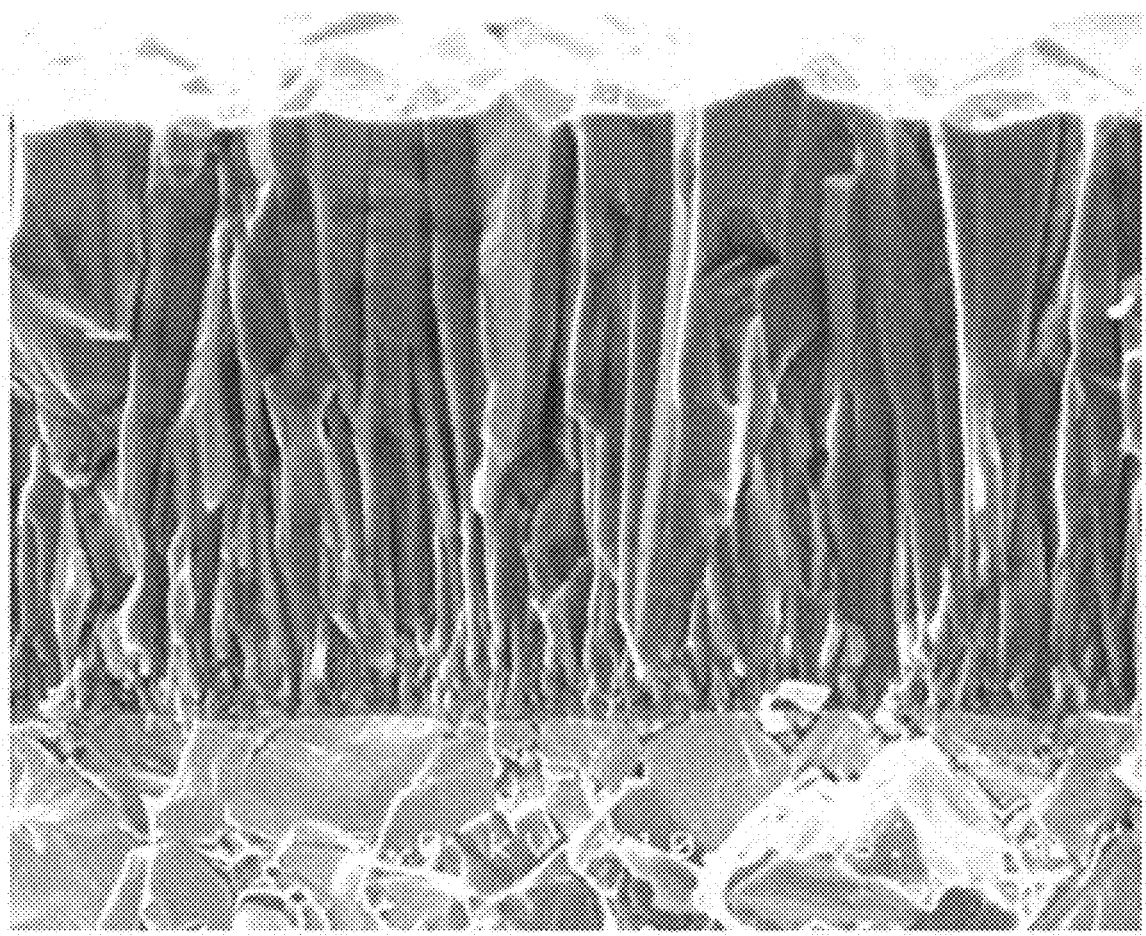
FIG. 1A is a photograph (magnification: 10,000×), substituted for drawing, of a scanning electron microscopic (SEM) image of a cross-section of a rake face of a coated cutting tool in Example 1.

The present inventors have arrived at the present invention from the following findings: Control of the orientation of crystal plane (311) of a complex nitride of Al and Cr results in enhanced durability of a cutting tool coated with such a complex nitride. The inventors have determined the X-ray diffraction intensities assigned to crystal planes of the complex nitride of Al and Cr and compared the X-ray diffraction intensity assigned to crystal plane (311) with X-ray diffraction intensities assigned to other planes. Surprisingly, the inventors have found that the durability of the coated cutting tool is enhanced if the X-ray diffraction intensity assigned to crystal plane (311) and those of the other crystal planes satisfy a specific relationship.

The inventors have also gained the following insight: In order to inhibit the excess reaction of gaseous alkaline $NH_3$ with halide gases, such as gaseous $CrCl_3$ and $AlCl_3$, the ratio of the amount of $NH_3$ to the total amount of $N_2$ and $H_2$ in the mixed gas is controlled to a specific range. Furthermore, the inventors have found that gaseous chromium chloride must be generated in a CVD furnace.

The composition, structure, crystal structure, and properties of a hard film of a cutting tool according to an embodiment of the present invention, a method of depositing the hard film, and a deposition system will now be described in detail.

<Composition>

The composition of a hard film of the present embodiment will now be described.

The hard film of this embodiment includes a complex nitride of Al and Cr. The film including the complex nitride of Al and Cr exhibits high wear resistance and high thermal resistance.

«Aluminum (Al)»

A high Al content enhances the thermal resistance of the hard film and facilitates formation of a lubricating protection film at the edge of the coated cutting tool, resulting in high durability of the cutting tool. In order to achieve reproducible results on these effects, the Al content in the hard film of the present embodiment is 60 atom % or more relative to the total amount of metal and metalloid elements (hereinafter collectively referred to as "metal elements"). The Al content in the hard film is more preferably 70 atom % or more. A higher Al content, however, generates much crystalline AlN having a hexagonal close-packed (hcp) structure with low wear resistance, resulting in low durability of the coated cutting tool. For this reason, the Al content in the hard film is preferably 90 atom % or less.

«Chromium (Cr)»

A significantly low Cr content causes an increase in AlN having an hcp structure with low wear resistance, resulting in low durability of the coated cutting tool. In addition, a lubricating protection film cannot be readily formed at the edge of the tool, resulting in thermal sticking. For this reason, the Cr content is 10 atom % or more. The Cr content is preferably 15 atom % or more. A higher Cr content, however, results in a reduction in relative Al content and low thermal resistance. Thus, the Cr content is preferably 30 atom % or less.

«Other Elements»

The total content of Al and Cr in the hard film of the present embodiment is 90 atom % or more to achieve high thermal resistance of the hard film. The total content of Al and Cr in the hard film is more preferably 95 atom % or more. The hard film of this embodiment may contain one or more metal elements, for example, Ti, Si, Zr, B, and V, besides Al and Cr. These elements are generally added to AlTi-based complex nitride and AlCr-based complex nitride. Addition of a small amount of such elements does not significantly reduce the durability of the coated cutting tool.

In other words, addition of these metal elements does not significantly reduce the durability of the coated cutting tool in the case that the ratio TC of the X-ray diffraction intensity assigned to crystal plane (311) of the complex nitride of Al and Cr with a total content of Al and Cr of 90 atom % or more is at or above a specific value that will be described below. A higher total content of metal element(s) other than Al and Cr results in unsatisfactory basic properties of the complex nitride of Al and Cr and thus low durability of the coated cutting tool. The total content of such metal element(s) in the complex nitride is 10 atom % or less. The hard film of the present embodiment may consist essentially of a complex nitride of Al and Cr.

«Incidental Impurities»

The hard film of the present embodiment may contain incidental impurities or components of gases remaining during formation of the film, for example, oxygen, carbon, and chlorine, in a content of 1 mass % or less based on the total content of 100 mass % of the hard film. The hard film of this embodiment, which mainly includes a complex nitride, may partially contain, for example, oxide, complex carbide of Al and Cr, or complex carbonitride derived from these impurities.

<Crystal Structure>

The hard film of the present embodiment includes a complex nitride that primarily has a face-centered cubic lattice (fcc) structure with crystal planes exhibiting peaks in X-ray diffractometry, where one of the peaks has the highest intensity. A hard film mainly including a complex nitride having an hcp structure and an amorphous hard film have low hardness and low wear resistance, resulting in significantly low durability of a coated cutting tool. The fcc structure with crystal planes, one of which exhibits the highest peak intensity, enhances the hardness and toughness of the hard film, resulting in high durability of the coated cutting tool.

The hard film of the present embodiment preferably includes a complex nitride having only an fcc structure. Alternatively, the hard film may include a complex nitride partially having an hcp structure as long as one of the crystal planes of the fcc structure exhibits the highest peak intensity. For example, the hard film may include a complex nitride partially having an hcp structure in the case of milling of a soft steel with a HRC of 30 or less because high hardness is not required. A significantly high content of a complex nitride having an hcp structure reduces durability of the coated cutting tool. Even though a complex nitride partially has an hcp structure, the highest peak intensity based on the hcp structure is preferably 1/10 or less of that of the fcc structure.

The hard film of the present embodiment includes a complex nitride that has an fcc structure exhibiting at least nine peaks assigned to crystal planes (111), (200), (220), (311), (222), (400), (331), (420), and (422) in X-ray diffractometry. The present inventors have found that a high ratio of the X-ray diffraction intensity assigned to crystal plane (311) results in an increase in fine columnar grains.

In the present embodiment, the ratio of the X-ray diffraction intensity assigned to crystal plane (311) is defined as a ratio TC (311) of the X-ray diffraction intensity and is determined to be 1.30 or more, as described below. The inventors have also found the following facts: The ratio TC (311) of the X-ray diffraction intensity is enhanced compared to those observed from other crystal planes (eight crystal planes excluding crystal plane (422) among the nine crystal planes; the data of the X-ray diffraction intensity assigned to crystal plane (422) of aluminum nitride is not listed in the standard X-ray diffraction intensities described below). The hard film thereby has a finer structure, and the plastic deformation of the hard film is restrained. Furthermore, the wear of the film is reduced.

In the present embodiment, the ratio TC (311) of the X-ray diffraction intensity is determined by the following expression (Exp. 1) from the crystal planes including plane (311). The ratio TC (311) of the X-ray diffraction intensity is then evaluated.

$$TC(311)=\{I(311)/Io(311)\}/[\Sigma\{I(hkl)/Io(hkl)\}/8] \quad \text{(Exp 1)}$$

I(hkl): the observed X-ray diffraction intensity assigned to each crystal plane (hkl) of a complex nitride of aluminum and chromium in the hard film.

Io(hkl): the standard X-ray diffraction intensity assigned to the corresponding crystal plane (hkl) of the aluminum nitride listed in File No. 00-025-1495 available from International Center for Diffraction Data (ICDD).

Σ represents the sum of the observed X-ray diffraction intensities assigned to eight crystal planes (111), (200), (220), (311), (222), (400), (331), and (420).

Since the standard X-ray diffraction intensities of complex nitride of aluminum and chromium are not listed in the file, the standard X-ray diffraction intensities of aluminum nitride are used that exhibits X-ray diffraction pattern similar to that of the complex nitride of aluminum and chromium.

According to the diffraction angle 2θ and the standard X-ray diffraction intensity Io that correspond to each crystal plane of aluminum nitride with an fcc structure, listed in ICDD File No. 00-025-1495, aluminum nitride with an fcc structure has a high X-ray diffraction intensity assigned to crystal plane (420). Since the standard X-ray diffraction intensities do not include the X-ray diffraction intensity assigned to crystal plane (422) of aluminum nitride, the ratios TC (hkl) of the X-ray diffraction intensities are determined from the eight crystal planes.

A complex nitride including Al and Cr, and having crystal plane (311) exhibiting a ratio TC (311) of the X-ray diffraction intensity of 1.30 or more can enhance durability of a coated cutting tool. The ratio TC (311) of the X-ray diffraction intensity is more preferably 1.80 or more. The ratio TC (311) of the X-ray diffraction intensity is further preferably 2.00 or more. Although the upper limit of the ratio TC (311) of the X-ray diffraction intensity may be any value, the upper limit is expected to be about 6.00 in the case of the complex nitride produced by a method disclosed in this specification. The upper limit is more preferably 5.00.

The ratio TC (311) of the X-ray diffraction intensity is more preferably higher than the ratio TC (hkl) of the X-ray diffraction intensity assigned to any other crystal plane.

Each of the ratios TC (420) and (200) of the X-ray diffraction intensities according to the hard film of the embodiment is preferably 1.00 or less, for the reason that low ratios TC (420) and (200) of the X-ray diffraction intensities, which have high peak intensities in the standard X-ray diffraction pattern, enhance the ratio TC (311) of the X-ray diffraction intensity. Each of the ratios TC (420) and (200) of the X-ray diffraction intensities is more preferably 0.50 or less.

The X-ray diffraction peaks of a hard film including a complex nitride of aluminum and chromium are similar to those of a hard film including a complex nitride of titanium and aluminum and have overlapping peak positions. In the case of a multilayer, for example, an alternating multilayer of the hard films of the present invention and hard films including a complex nitride of titanium and aluminum, the observed X-ray diffraction peak of the complex nitride of titanium and aluminum can be used as that of the complex nitride of aluminum and chromium in the hard film for calculation of the ratio TC (hkl) of the X-ray diffraction intensities.

The hard film of the present embodiment preferably satisfies a ratio TB/TA of 0.05 or more in the X-ray diffractometry, where TA represents the total peak intensity of the fcc structure (the sum of the X-ray diffraction peak intensities assigned to the eight crystal planes and the X-ray diffraction peak intensity assigned to crystal plane (422)); and TB represents the X-ray diffraction peak intensity assigned to crystal plane (422). In general, the peak intensity assigned to a crystal plane at a high angle, like crystal plane (422), is relatively low. A higher peak intensity assigned to crystal plane (422) results in a hard film with a higher crystallinity and enhanced durability of the coated cutting tool. Furthermore, a ratio TB/TA of 0.07 or more often results in enhanced durability.

Although not listed in ICDD File No. 00-025-1495, the peak intensity assigned to crystal plane (422) can be determined from the lattice spacing d using an X-ray diffraction pattern.

<Columnar Grain>

The hard film of the present embodiment includes aggregates of columnar grains (or a columnar structure) grown on a substrate of a cutting tool along the thickness of the film. The complex nitride of Al and Cr, which is in the form of columnar grains grown on the substrate along the thickness of the hard film, enhances the durability of the coated cutting tool.

Each columnar grain preferably has an average width of 0.1 μm or more and 2.0 μm or less near the surface. An average width of 0.1 μm or more enhances durability of the coated cutting tool. An average width of 2.0 μm or less inhibits plastic deformation of the hard film. Since grains detached from the hard film have a small diameter, wear of the tool is delayed.

The term "surface" in this embodiment refers to a portion, near a surface coming into contact with a work material, of the hard film, for example, a cross-section polished (CP) face. The width of a columnar grain in the hard film can be determined by observation of a transmission electron microscopic or scanning electron microscopic cross-section. The observed site inside the hard film is disposed at 0.5 μm from the surface, in contact with a work material, of the hard film. Observation of consecutive 30 or more of columnar grains can results in a converged average width of the grains. Thus, the average width can be determined from consecutive 30 or more of columnar grains.

<Micro Structure>

The hard film of the present embodiment may have any micro structure. In other words, the hard film may contain crystal grains each consisting of only a monolayer structure. Alternatively, the hard film may contain crystal grains each consisting of only a multilayer structure. Alternatively, the hard film may contain crystal grains each consisting of only a monolayer structure, only a multilayer structure, or both monolayer and multilayer structures. In particular, it is preferred that one crystal grain consists of monolayer and multilayer structures that are dispersed.

Figure 2A:
FIG. 2A is a photograph (magnification: 200,000×), substituted for drawing, of an image taken by transmission electron microscopy (TEM) of a hard film of Example 1.
Figure 2B:
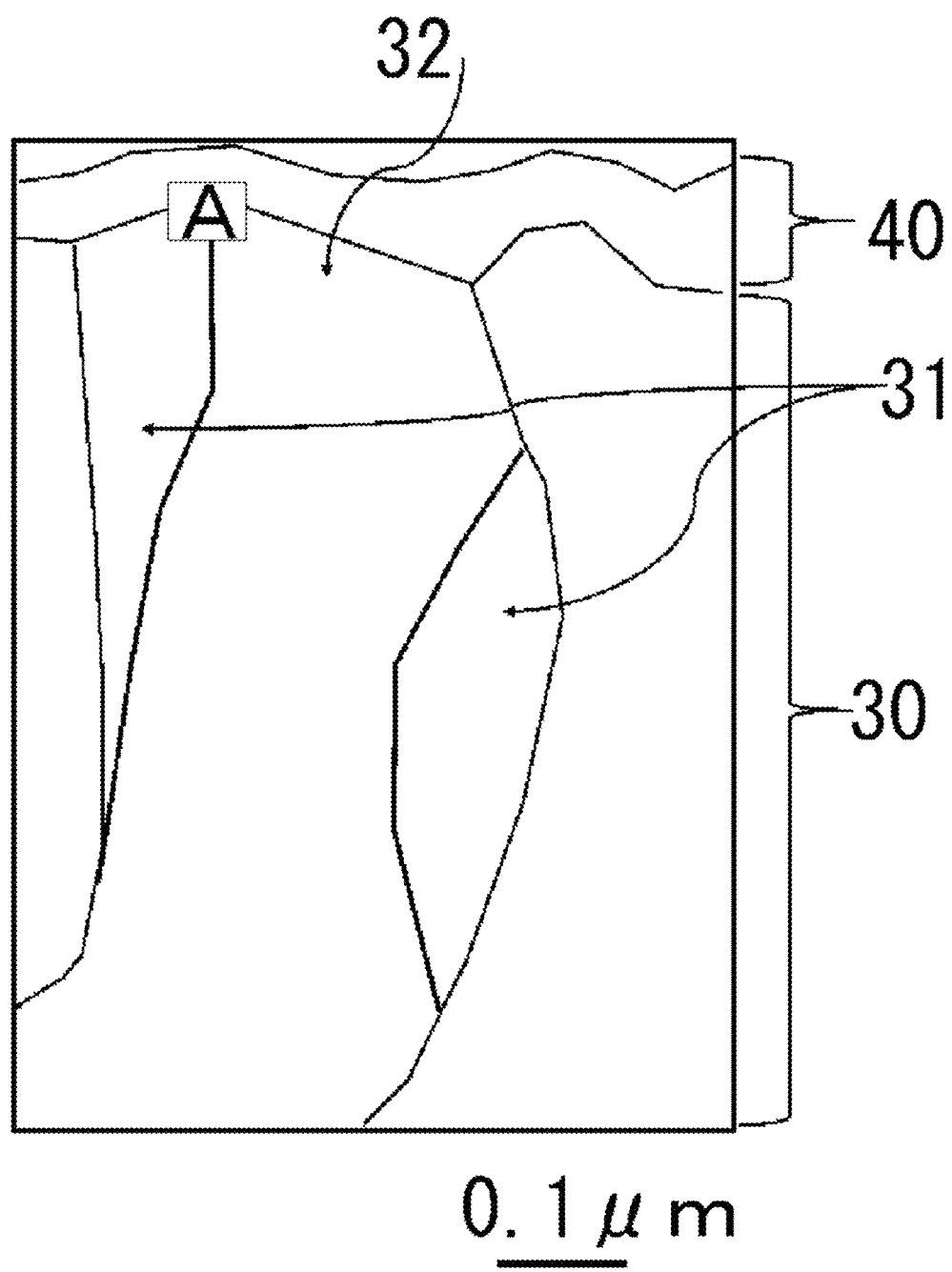
FIG. 2B is a schematic diagrammatic view of the photograph in FIG. 2A.
Figure 2C:
FIG. 2C is a photograph, substituted for drawing, generated by dithering of the photograph in FIG. 2A.

It is preferred that one crystal grain consists of a multilayer structure of alternating complex nitrides each including Al and Cr and having a relatively high or low Al content and a monolayer structure of a complex nitride including Al and Cr and having a relatively high Al content and that such crystal grains are dispersed in a micro structure as illustrated in FIGS. 2A, 2B, and 2C (see FIGS. 3A, 3B, 3C, 5A, 5B, and 5B with respect to enlarged views).

The monolayer structure has higher crystallinity than the multilayer structure and presumably has less distortion. Thus, the crystal grains having such a monolayer structure result in enhanced durability of the coated cutting tool. The multilayer structure contains less Al than the monolayer structure and reduces the overall Al content in a crystal grain to inhibit an increase in AlN having an hcp structure with low wear resistance. Such grains in a micro structure results in enhanced wear resistance, enhanced thermal resistance, and high durability on the whole.

In the multilayer structure of crystal grains, the Al content in the complex nitride including Al and Cr and having a relatively high Al content is preferably 60 atom % or more and the Al content in the complex nitride including Al and Cr and having a relatively low Al content is preferably 55 atom % or less.

The Al content in the complex nitride including Al and Cr and having a relatively high Al content is preferably 70 atom % or more, more preferably 80 atom % or more in the multilayer structure of crystal grains. A higher content of Al, however, results in an increase in AlN having an hcp structure. Thus, the Al content is preferably 95 atom % or less and more preferably 90 atom % or less.

The Al content in the complex nitride including Al and Cr and having a relatively low Al content is preferably 50 atom % or less, more preferably 40 atom % or less in the multilayer structure of a crystal grain. A lower Al content, however, results in a reduction in thermal resistance of the overall hard film. Thus, the Al content is preferably 10 atom % or more, more preferably 20 atom % or more.

The Al content in the monolayer structure of a crystal grain is preferably 60 atom % or more. The Al content is more preferably 70 atom % or more. A higher Al content, however, results in an increase in AlN having an hcp structure. Thus, the Al content in the monolayer structure of crystal grains is preferably 90 atom % or less.

The hard film of the present embodiment may have a micro structure of crystal grains each consisting of only a multilayer structure or only a monolayer structure.

<Average Thickness of Film>

The hard film of the present embodiment preferably has an average thickness of 1.0 μm or more and 15.0 μm or less because a thickness of less than 1.0 μm may be too small to impart a sufficient lifetime to a tool whereas a thickness above 15.0 μm may be too large to maintain the level of precision in cutting. The lower limit of the thickness is more preferably 2.0 μm, more preferably 3.0 μm, further preferably 5.0 μm. The upper limit of the thickness is more preferably 12.0 μm, further preferably 10.0 μm.

<Intermediate Film and Upper Layer>

The coated cutting tool of the present embodiment may be provided with an intermediate film that is disposed between the substrate of the tool and the hard film and includes, for example, any of nitride, carbonitride, and carbide as required, for enhancement of adhesion of the hard film to the substrate. The intermediate film preferably includes complex nitride of Al and Ti, nitride of Ti, or complex carbonitride to result in high adhesion between the substrate and the hard film. In this specification, a compound that is not expressed by a formula, like complex nitride or carbonitride of Al and Ti, or nitride or carbonitride of Ti, may be non-stoichiometric.

The hard film of the present embodiment may be provided with an upper layer containing a different proportion of components or having a different composition from the hard film. The upper layer may include, for example, nitride, carbonitride, carbide, or oxide, such as alumina, and may be provided through the intermediation of a bonding layer. Among the components, alumina that is commonly used for formation of a coating film by chemical vapor deposition is preferred because it enhances thermal resistance of the coated cutting tool.

For example, a cutting process of a cast metal commonly involves use of a cutting tool coated with alumina. The coated cutting tool of the present invention may be provided with an upper layer including alumina as required and can thereby exhibit high durability. The upper layer may be a film including a complex nitride of Al and Ti or including an alternating multilayer of a complex nitride of Al and Cr with a relatively high Al content and a complex nitride of Al and Cr with a relatively low Al content.

<Treatment of Edge after Coating>

Since the hard film of the present embodiment is formed by chemical vapor deposition and thus has a tensile stress, the edge of the cutting tool is preferably treated after coating, where the hard film is released from the stress by, for example, a blasting device. The treatment of the edge after coating enhances resistance to chipping, resulting in a hard film that provides a long lifetime to the cutting tool.

<Method of Production>

The hard film of the present embodiment can be formed on the substrate of the cutting tool, such as an insert substrate predisposed in a chemical vapor deposition system (CVD furnace), by, for example, separate feeding of mixed gases A and B into the system heated to 750° C. or more and mixing of the mixed gases A and B, which will be described below.

Any known substrate can be used. Examples of such substrates include cemented carbide (for example, WC-based cemented carbide and a cemented carbide containing Co in addition to WC and further containing carbide, such as Ti, Ta, and Nb), cermet (mainly containing, for example, TiC, TiN, or TiCN), and cBN.

Examples of the substrate of a cutting tool include drills, drill edge-replaceable cutting tips, milling edge-replaceable cutting tips, metal saws, reamers, and taps, in addition to insert substrate.

«Mixed Gas A»

In the present embodiment, a mixed gas A consists of a mixed gas a1 and a mixed gas a2. The mixed gas a1 contains HCl and $H_2$ (also referred to as "gaseous components for generating chromium chloride" or "gaseous components resulting in the mixed gas a1) and chromium chloride generated by contact of these two gaseous components (this gaseous chromium chloride contains not only a component that can be expressed by $CrCl_3$ but also gaseous components of chemically bonded Cr and Cl). The mixed gas a1 has a typical composition of $0.008 \leq$ chromium chloride/$H_2 \leq 0.140$ as expressed by a volume ratio. The mixed gas a2 contains $AlCl_3$ and $H_2$ and has a typical composition of $0.0006 \leq AlCl_3/(H_2+N_2) \leq 0.0300$ as expressed by a volume ratio.

The volume percentages of gaseous chromium chloride and $AlCl_3$ are estimated from the volume of gaseous HCl fed for generation of these gaseous chromium chloride and $AlCl_3$, which will be described below.

HCl and $H_2$ in the mixed gas a1 are heated and brought into contact with metallic chromium to generate gaseous chromium chloride. HCl and $H_2$ are preferably heated in a gas preheating chamber in the CVD furnace, as described below with respect to the CVD furnace or deposition system. The mixed gas a1 containing resultant chromium chloride is preferably mixed with the mixed gas a2 heated substantially to the temperature of the mixed gas a1, resulting in the mixed gas A. In this way, gaseous chromium chloride is readily generated without impact of gaseous $AlCl_3$.

The temperature for generation of gaseous chromium chloride in the gas preheating chamber is about 750° C., which is a lower limit of the temperature of the furnace. Gaseous chromium chloride is stably generated at this temperature. A lower temperature results in a reduction in generated chromium chloride, which facilitates formation of an Al-abundant hard film as a whole and thus formation of AlN having an hcp structure.

$AlCl_3$ in the mixed gas a2 can be generated by, for example, feeding of a mixture of $H_2$ and HCl into an $AlCl_3$ gas generator containing metal Al at 330° C. $AlCl_3$ is preheated while it is mixed with the mixed gas a1 into the mixed gas A. A smaller difference in temperature between the mixed gas a1 and the gas a2 is preferred because a hard film with a structure including aggregates of columnar grains can be produced. The temperature of the mixed gas a2 is preferably around that of the mixed gas a1 (for example, ±80° C.).

The flow rate of $H_2$ in the mixed gas A resulting from mixing of the mixed gases a1 and a2 is preferably the highest. In addition, the mixed gases a1 and a2 may contain $N_2$ and Ar.

«Mixed Gas B»

A mixed gas B contains $H_2$, $N_2$, and $NH_3$. The mixed gas B preferably satisfies the relation 0.002≤b2/b1≤0.020 to achieve the composition of the hard film of the present embodiment, where b1 represents the total volume percentage of $N_2$ and $H_2$ and b2 represents the volume percentage of $NH_3$. The mixed gas B satisfying this relation can inhibit an excess reaction of alkaline $NH_3$ with halogenous $CrCl_3$ and $AlCl_3$.

Although the mixed gas B is also preheated, a significant rise in temperature during preheating should be avoided. The mixed gas B is thus heated at a temperature lower than the mixed gas A to avoid excess preheating.

A flow path for the mixed gas B in a preheating chamber and the preheating chamber are disposed at the same level to prevent excess preheating of the mixed gas B, unlike the mixed gas A. Such temperature control can prevent an excess reaction of $NH_3$ in the mixed gas B with chromium chloride and $AlCl_3$ in mixed gas A, resulting in a hard film with a structure including aggregates of columnar grains.

Although a flow path for the mixed gas B extends through the gas preheating chamber, the preheating temperature is kept lower to avoid excess preheating. One possible means for achieving such preheating of the mixed gas B is to dispose flow paths for generation of the mixed gases a1 and a2 adjacent to a source for preheating and a flow path for the mixed gas B remote from the source, as in the preheating chamber of the CVD furnace of the present embodiment, which will be described below. The total length of the flow paths for mixed gases a1 and a2 is extended in a range between three times or more, preferably five times or more and eight times or less the length of the flow path for the mixed gas B.

The extension factor may be appropriately determined based on the capacity of the system and may be ten times, further twenty times. For example, the flow path for the mixed gas B is preferably 650 mm or less, more preferably 550 mm or less. An excess reaction of $NH_3$ with $AlCl_3$ and chromium chloride are thereby inhibited, resulting in a hard film with a structure including aggregates of columnar grains.

In this context, the flow path for the gaseous components resulting in the mixed gas a1, the flow path for the mixed gas a2, and the flow path for the mixed gas B refer to routes from inlets of the respective mixed gases to the end points of preheating. In other words, each flow path includes a flow path connection turnable during formation of a hard film and a flow path in the preheating chamber, like the preheating chamber (described below) of the CVD furnace of the present embodiment.

«Mixing and Feeding of Mixed Gases A and B into Furnace»

If the mixed gases A and B are premixed and fed into the CVD furnace (or into a reaction container) through one nozzle, the reaction of $NH_3$ with $AlCl_3$ and chromium chloride will be excessively accelerated. Thus, a hard film that has a structure including aggregates of columnar grains is unlikely to be produced.

For this reason, the mixed gases A and B are not mixed before being fed into the CVD furnace or the reaction container and nozzles are separately disposed for the mixed gases A and B. The mixed gases A and B are separately fed into the CVD furnace or the reaction container. In detail, the nozzle for the mixed gas B and the nozzle for the mixed gas A are oriented to different directions. For example, the nozzle for the mixed gas B has a different discharging direction from the nozzle for the mixed gas A. The nozzle for the mixed gas A is disposed farther away from the rotation axis of a pipe than the nozzle for the mixed gas A, which will be described below with respect to, for example, the chemical vapor deposition system, to control acceleration of the reaction of $NH_3$ with $AlCl_3$ and chromium chloride.

«Reaction Pressure and Temperature of Film Formation»

The reaction pressure for formation of a hard film is preferably 3 kPa or more and 5 kPa or less. A lower reaction pressure reduces the rate of formation of a hard film whereas a higher temperature prompts the reaction that precludes formation of a hard film with a structure including aggregates of columnar grains.

The temperature in the CVD furnace or the reaction container is preferably 750° C. or more and 850° C. or less. A lower temperature for formation of a hard film results in an increase in chlorine in the hard film and a reduction in wear resistance whereas a higher temperature for formation of a hard film prompts the reaction that precludes formation of a hard film with a structure including aggregates of columnar grains. The temperature in the furnace is preferably 770° C. or more and 820° C. or less.

<Deposition System>

In a chemical vapor deposition system (CVD furnace) according to one embodiment of the present invention, the temperature in the furnace or the reaction container can be controlled to 750° C. or more and 850° C. or less and the pressure in the furnace or the reaction container to 3 kPa or more and 5 kPa or less, to perform the method of production described above. The system has the following characteristic configuration. This chapter focuses on essential features of the system and the configuration will be detailed in Examples below.

The deposition system can separately preheats three types of mixed gases, i.e., the mixed gas a1 for generating chromium chloride being a component of the mixed gas A, the mixed gas a2, and the mixed gas B. These mixed gases are separately fed into the CVD furnace or the reaction container.

The CVD furnace includes the gas preheating chamber and a gas discharger described below feeding the gases A B into the reaction container. The gas preheating chamber includes:

(1) a gas generator bringing a mixed gas for generation of gaseous chromium chloride into contact with a metallic chromium to generate a mixed gas a1 containing chromium chloride;

(2) a first preheater preheating the mixed gas a2;

(3) a second preheater preheating the mixed gas B; and (4) a mixer mixing the gas a1 with the gas a2 to generate the mixed gas A.

A separate heat source for the preheating chamber may be provided or a heat source (heater) of the CVD furnace may be used. Metallic chromium preferably is in the form of flakes to facilitate generation of gaseous chromium chloride.

In the case that the heat source of the CVD furnace is used as one means for controlling the temperatures of the mixed gases in the preheating chamber, the flow paths for generation of the mixed gases a1 and a2 are disposed adjacent to, for example, the preheating source or heater of the CVD furnace and the flow path for the mixed gas B is disposed remote from the source. The flow paths are disposed, for example, such that the total length of the flow path for generation of the mixed gas a1 and the flow path for the mixed gas a2 is three times or more, preferably five times or more, and eight times or less the length of flow path of the mixed gas B.

In this context, the flow path for gaseous components for generating the mixed gas a1, the flow path for the mixed gas a2, and the flow path for the mixed gas B refer to routes from inlets of the CVD furnace to the outlets of the gas preheating chamber. In other words, each flow path includes a flow path connection turnable during formation of a film and a flow path in the preheating chamber in the CVD furnace in Example (described below).

In such a configuration, the mixed gas a1 is heated to 750° C. or more whereas the mixed gas a2 is heated at a temperature comparable to that of mixed gas a1, for example, at a temperature in the range of ±80° C. from the temperature of the mixed gas a1. The mixed gas a2 can be mixed with the mixed gas a1 to generate the mixed gas A. In contrast, the temperature of the mixed gas B is lower than that of the mixed gas A (TeA>TeB).

The flow path for the mixed gas A has a long distance in the preheating chamber. Thus, the temperature of the mixed gas A rises substantially to the temperature in the furnace. In contrast, the flow path for the mixed gas B has a short distance in the preheating chamber. Thus, the temperature of the mixed gas B does not significantly rise.

The CVD furnace further includes a gas discharger that includes a first pipe having nozzles for feeding of the mixed gas A and at least one second pipe having nozzles for feeding of the mixed gas B. For example, it is preferred that two second pipes are disposed on opposite sides of the first pipe and turns around the axis of the first pipe at a rate of two to five rounds per minute.

The nozzles for the mixed gas A disposed too close to the nozzles for the mixed gas B cause a vigorous reaction that precludes formation of a hard film with a structure including aggregates of columnar grains and uniformity of the hard film. In contrast, the nozzles for the mixed gas A disposed too far away from the nozzles for the mixed gas B cause insufficient delivery of the gases, which precludes uniformity of the hard film. For example, the lower limit of the ratio H2/H1 is preferably 1.5 and the upper limit of H2/H1 is preferably 4, more preferably 3, where H1 represents the distance from a nozzle for the mixed gas A to a rotation axis of the second pipes (the axis of the first pipe); and H2 represents the distance from a nozzle for the mixed gas B to the rotation axis of the second pipes (the axis of the first pipe), as illustrated in FIG. 9C.

In addition, the nozzle for the mixed gas A is preferably oriented to different directions from the nozzles for the mixed gas B at an angle of 30° to 90°.

EXAMPLES

The present invention will now be described with reference to examples. The invention should not be construed to be limited to these examples.

<Deposition System>

Figure 9A:
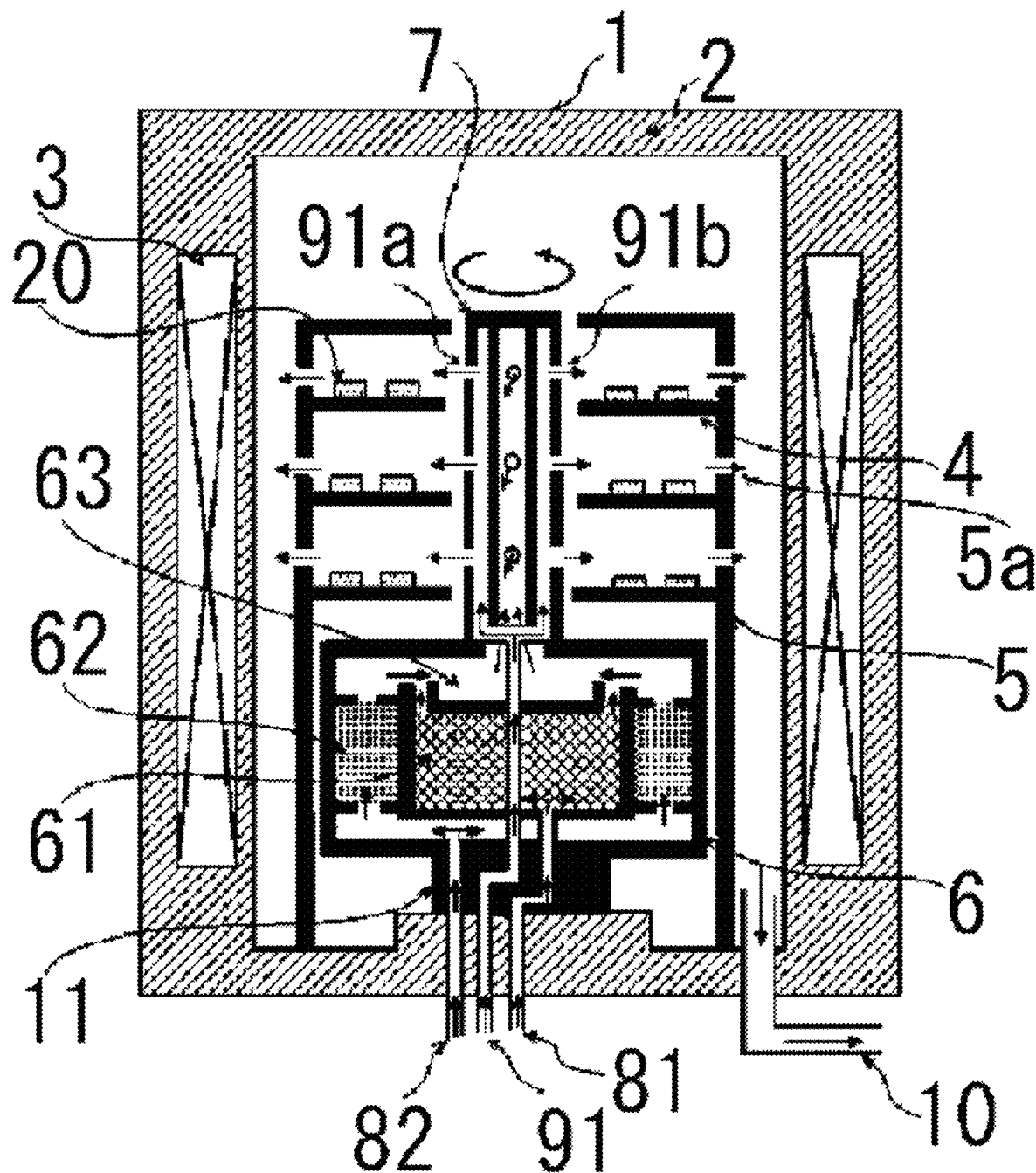
FIG. 9A is a schematic diagram of a chemical vapor deposition system (CVD furnace) for formation of hard films in Examples.
Figure 9B:
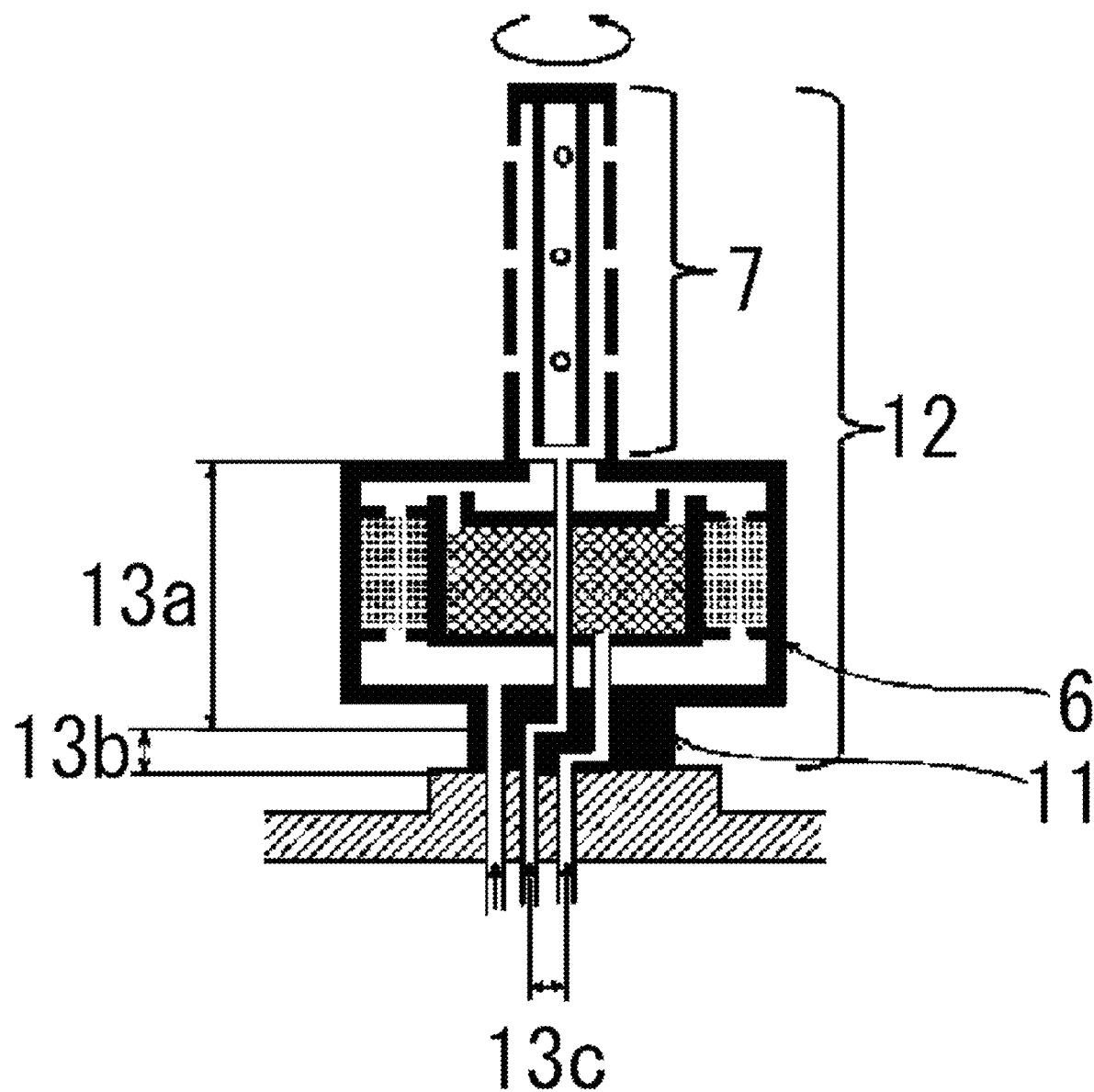
FIG. 9B is an enlarged schematic diagram of main components of the chemical vapor deposition system (CVD furnace) for formation of hard films in Examples.
Figure 9C:
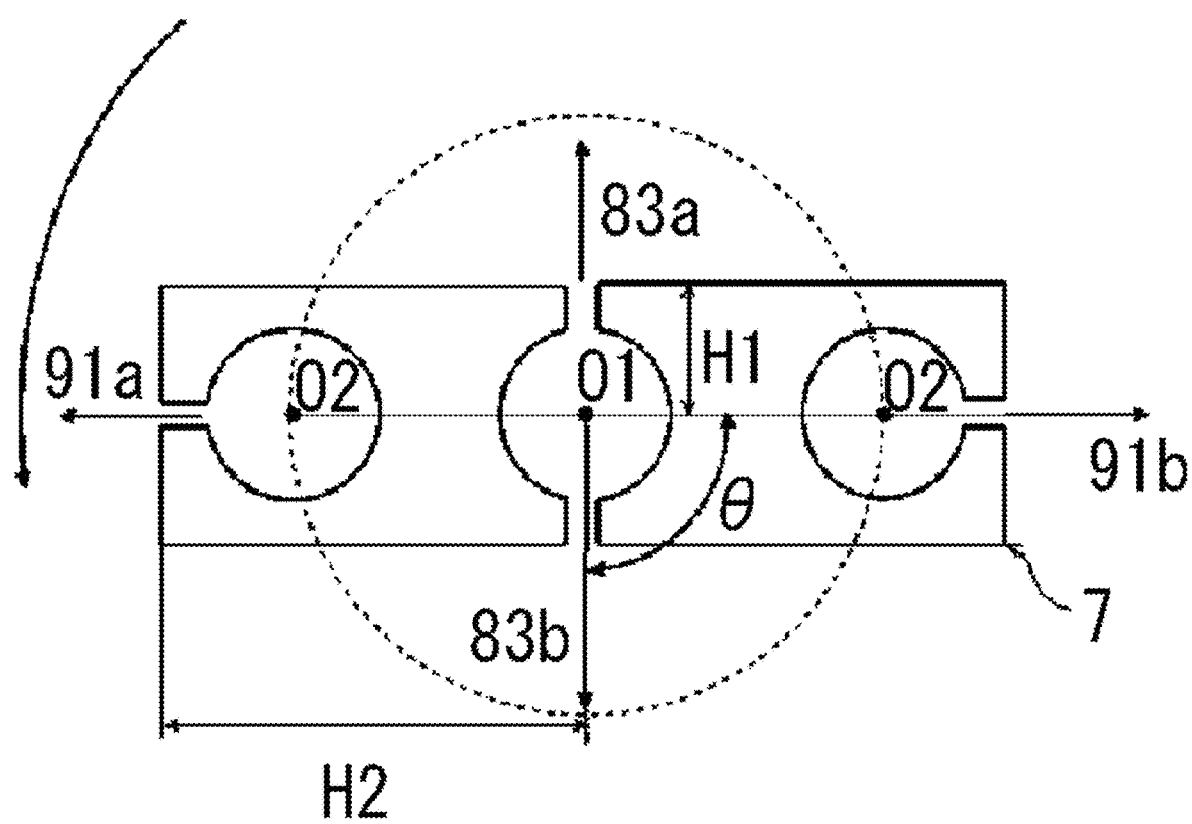
FIG. 9C is a schematic cross-sectional view of gas nozzles of the chemical vapor deposition system (CVD furnace) for formation of hard films in Examples.

In the examples, a chemical vapor deposition system 1 (CVD furnace) shown in FIGS. 9A, 9B, and 9C, which illustrate schematic diagrams of the system, is used. The overview of this system will now be described.

The CVD furnace 1 includes a cylindrical chamber 2, a heater 3 disposed in a peripheral wall of the chamber 2, a reaction container 5 including multiple insert shelves 4 receiving numerous insert substrates 20 (substrates for tools) in the chamber 2, a junction flow path 11 and a preheating chamber 6 that are disposed under the reaction container 5.

The preheating chamber 6 is generally cylindrical and includes a gaseous chromium chloride generating compartment 62, a preheating compartment 61 (first preheater), and a mixing compartment 63 (mixer) disposed above the gaseous chromium chloride generating compartment 62 and the preheating compartment 61, and has a space immediately under the gaseous chromium chloride generating compartment 62, the preheating compartment 61, and the mixing compartment 63.

The space receives a mixed gas for generation of gaseous chromium chloride from a flow path 82 via the flow path connection 11, radially diffuses the mixed gas in the preheating chamber 6, and feeds the mixed gas into the gaseous chromium chloride generating compartment 62.

The gaseous chromium chloride generating compartment 62 has an outer circumference overlapping with that of the preheating chamber 6 and a cylindrical space in the center. The preheating compartment 61 is disposed concentrically with the preheating chamber 6 in the cylindrical space.

The mixing compartment 63 mixes the mixed gas a1 (described below) with the mixed gas a2 to generate a mixed gas A.

A flow path (second preheater) is disposed in the preheating chamber 6, in other words, around the axis of the preheating compartment 61 and allows the mixed gas B from a flow path 91 to flows along the height. The flow path is connected to outer flow paths in a pipe 7 above the preheating chamber 6 and has a shortest distance (550 mm) for extending through the preheating chamber. The flow path for the mixed gas A in the mixing compartment 63 is connected to a central flow path in the pipe 7 above the preheating chamber 6.

The mixed gas from the flow path 82 is fed into the gaseous chromium chloride generating compartment 62 of the preheating chamber 6 and heated to 750° C. or more that is the temperature of the furnace. The mixed gas reacts with metallic chromium in the compartment to generate the mixed gas a1 containing chromium chloride. The mixed gas a1 is then fed into the mixing compartment 63.

As described above, the mixed gas B is fed into the outer flow paths in the pipe 7, then fed into the reaction container 5 through nozzles 91a and 91b. The mixed gas A, which is fed from the flow paths 81 and 82 and travels through the reheating compartment 61, is fed into the central flow path in the pipe 7 and then into the reaction container 5 through nozzles 83a and 83b.

The layout of the nozzles 83a and 83b and the nozzles 91a and 91b is illustrated in a cross-sectional view in FIG. 9C. The nozzles 91a and 91b are disposed farther away from the rotation axis O1 of the pipe 7 than the nozzles 83a and 83b. The distance from the nozzles 83a and 83b to the rotation axis O1 is represented by $H_1$, and the distance from the nozzles 91a and 91b to the rotation axis O1 is represented by $H_2$. The ratio $H_2/H_1$ is 2 in this example. The angle between the nozzles 91a and 91b and the nozzles 83a and 83b is 90°.

The flow path connection 11, the preheating chamber 6, and the pipe 7, which are bracketed by a reference numeral 12 in FIG. 9B, are configured to turn at a rate of two rounds per minute. In FIGS. 9A, 9B, and 9C, the rotational mechanism is not depicted.

Although FIGS. 9A and 9B do not illustrate a specific configuration, the total length of the flow path for the mixed gas a1 and the path for the mixed gas a2 is about four times the total length of flow paths 13a, 13b, 13c for the mixed gas B in FIG. 9B.

«Substrate»

Substrates prepared were a milling insert substrate (WDNW14520 available from Mitsubishi Hitachi Tool Engineering, Ltd.) including WC-based cemented carbide consisting of 10 mass % Co, 0.6 mass % $Cr_3C_2$, and the balance (WC and incidental impurities); and an insert substrate (SNMN120408 in accordance with the ISO standard) intended for evaluation of physical properties and including WC-based cemented carbide consisting of 7 mass % Co, 0.6 mass % $Cr_3C_2$, 2.2 mass % ZrC, 3.3 mass % TaC, 0.2 mass % NbC, and the balance (WC and incidental impurities).

«Formation of Intermediate Film»

In each of Examples 1 to 5 and 7 to 8, an intermediate film including titanium nitride was formed. The substrate was placed in the CVD furnace 1 illustrated in FIG. 9A. While gaseous $H_2$ was fed into the CVD furnace 1, the temperature in the CVD furnace was raised to 800° C. Subsequently, a mixed gas consisting of 83.1 vol % gaseous $H_2$, 15.0 vol % gaseous N2, and 1.9 vol % gaseous $TiCl_4$ was fed from the flow path 81 through a gas inlet of the preheating chamber 6 into the preheating compartment 61 at 800° C. under 12 kPa. The mixed gas was then fed through the first nozzles 83a and 83b of the pipe 7 into the reaction container 5 at a flow rate of 67 L/min. A titanium nitride film was formed thereby.

In Example 6, an intermediate film including a complex nitride of titanium and aluminum was formed. The substrate was placed in the CVD furnace 1 illustrated in FIG. 9A. While gaseous $H_2$ was fed, the temperature in the CVD furnace 1 was raised to 800° C. Subsequently, a mixed gas consisting of 0.15 vol % $TiCl_4$, 0.45 vol % $AlCl_3$, 7.50 vol % $N_2$, and 52.51 vol % $H_2$ was fed from the flow path 81 through the gas inlet of the preheating chamber 6 into the preheating compartment 62 at 800° C. under 4 kPa. The mixed gas was then fed through the first nozzles 83a and 83b of the pipe 7 into the reaction container 5. Another mixed gas consisting of 30.76 vol % $H_2$, 7.50 vol % $N_2$, and 1.13 vol % $NH_3$ was fed into the flow path 91. The mixed gas was then fed through the second nozzles 91a and 91b of the pipe 7 into the reaction container 5 at a flow rate of 67 L/min. A film including a nitride of titanium and aluminum was formed thereby.

Conditions for formation of the intermediate films are shown in Table 1.

«Formation of Hard Film»

«Step of Preparing Mixed Gas a1»

While gaseous $H_2$ was fed, the pressure in the CVD furnace 1 was reduced to 4 kPa. A mixed gas of $H_2$ and HCl was kept at 400° C. and fed from the flow path 82 into the preheating chamber 6 illustrated in FIG. 9A.

The gaseous chromium chloride generating compartment 62 of the preheating chamber 6, which was preheated at 800° C., contained Cr metal flakes (purity: 99.99%, size: 2 mm to 8 mm). Gaseous $H_2$ reacted with the mixed gas of $H_2$ and HCl fed from the flow path 82 to generate a mixed gas a1 of $H_2$ and chromium chloride. The mixed gas a1 was fed into the mixing compartment 63.

«Step of Preparing Mixed Gas A and Feeding Mixed Gas A into Reaction Container through Nozzles»

A mixed gas a2 of $H_2$ and $AlCl_3$ was fed from the flow path 81 through the gas inlet of the preheating chamber 6 into the preheating compartment 61.

The mixed gas a1 was mixed with the mixed gas a2 in the mixing compartment 63 to prepare a mixed gas A at a temperature around 800° C., which was the temperature of the preheating compartment. The resultant mixed gas A was fed into the reaction container through the first nozzles 83a and 83b of the pipe 7. The total flow rate of the mixed gas A was 48.75 L/min.

«Step of Feeding Mixed Gas B into Reaction Container through Nozzles»

A mixed gas B consisting of $H_2$, $N_2$, and $NH_3$ was fed from the flow path 91 via the second nozzles 91a and 91b of the pipe 7 into the furnace. The total flow rate of the mixed gas B was 30.25 L/min.

An $NH_3/(AlCl_3+CrCl_3)$ ratio of 0.18 to 0.39 in the total flow rate can more certainly inhibit an excess reaction of gaseous $NH_3$ with gaseous halogenous $CrCl_3$ and $AlCl_3$, resulting in stable formation of a hard film including a complex nitride of Al and Cr.

In Examples 1 to 8 and Comparative Example 1, films including a complex nitride of Al and Cr and having a thickness of about 6 μm were formed on the respective intermediate films in Table 1 by chemical vapor deposition using mixed gases with the compositions shown in Table 2, resulting in coated cutting tools. Comparative Example 1 did not satisfy the compositions of the mixed gases, defined in an embodiment of the present invention.

For determination of the compositions of the mixed gases, the volumes of generated chromium chloride and $AlCl_3$ were based on the assumption that ⅓ of the volume of HCl fed into the gaseous chromium chloride generating compartment corresponded to the volume of chromium chloride.

Figure 10A:
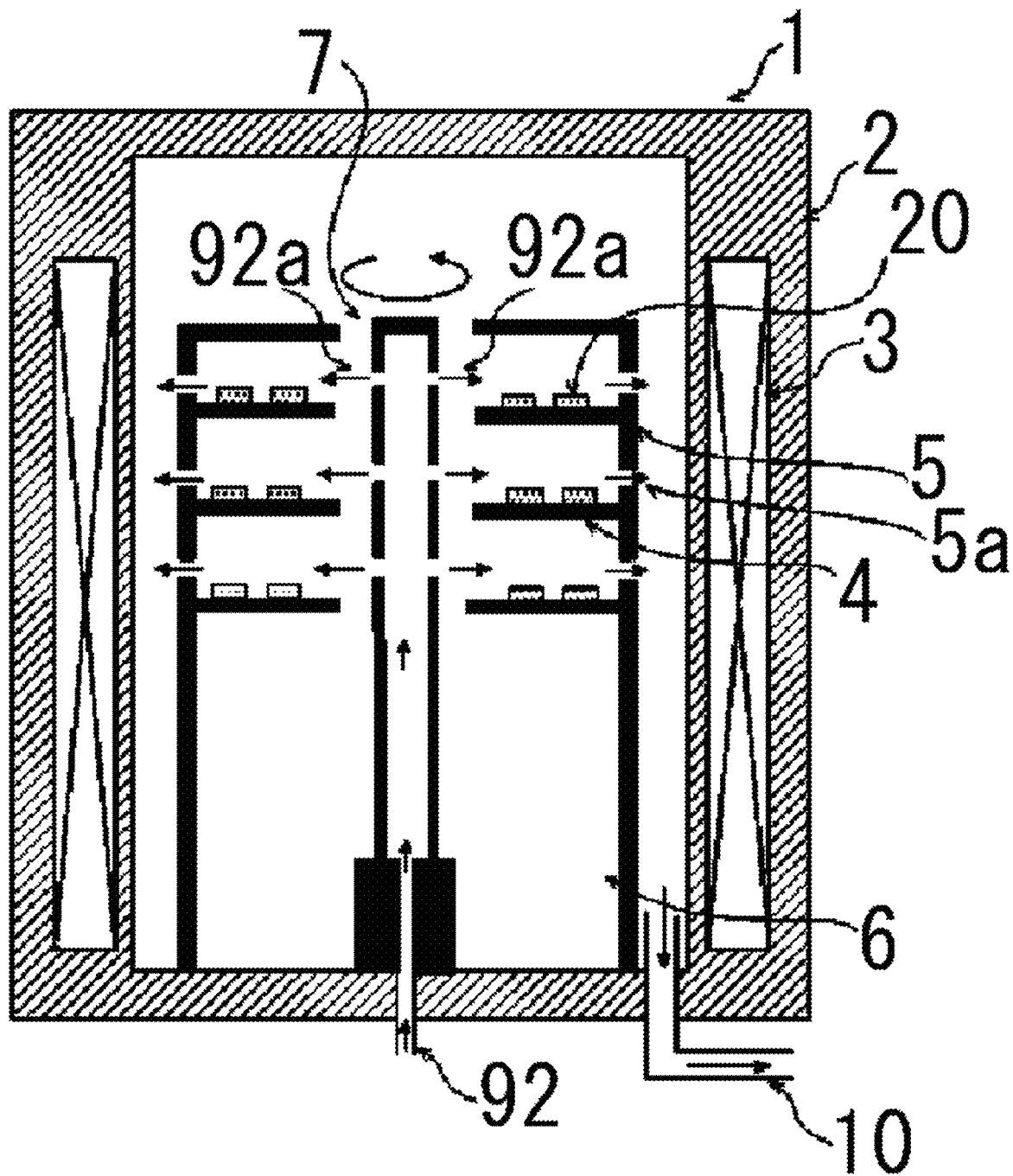
FIG. 10A is a schematic diagram of a chemical vapor deposition system (CVD furnace) for formation of a hard film in Comparative Example 2.
Figure 10B:
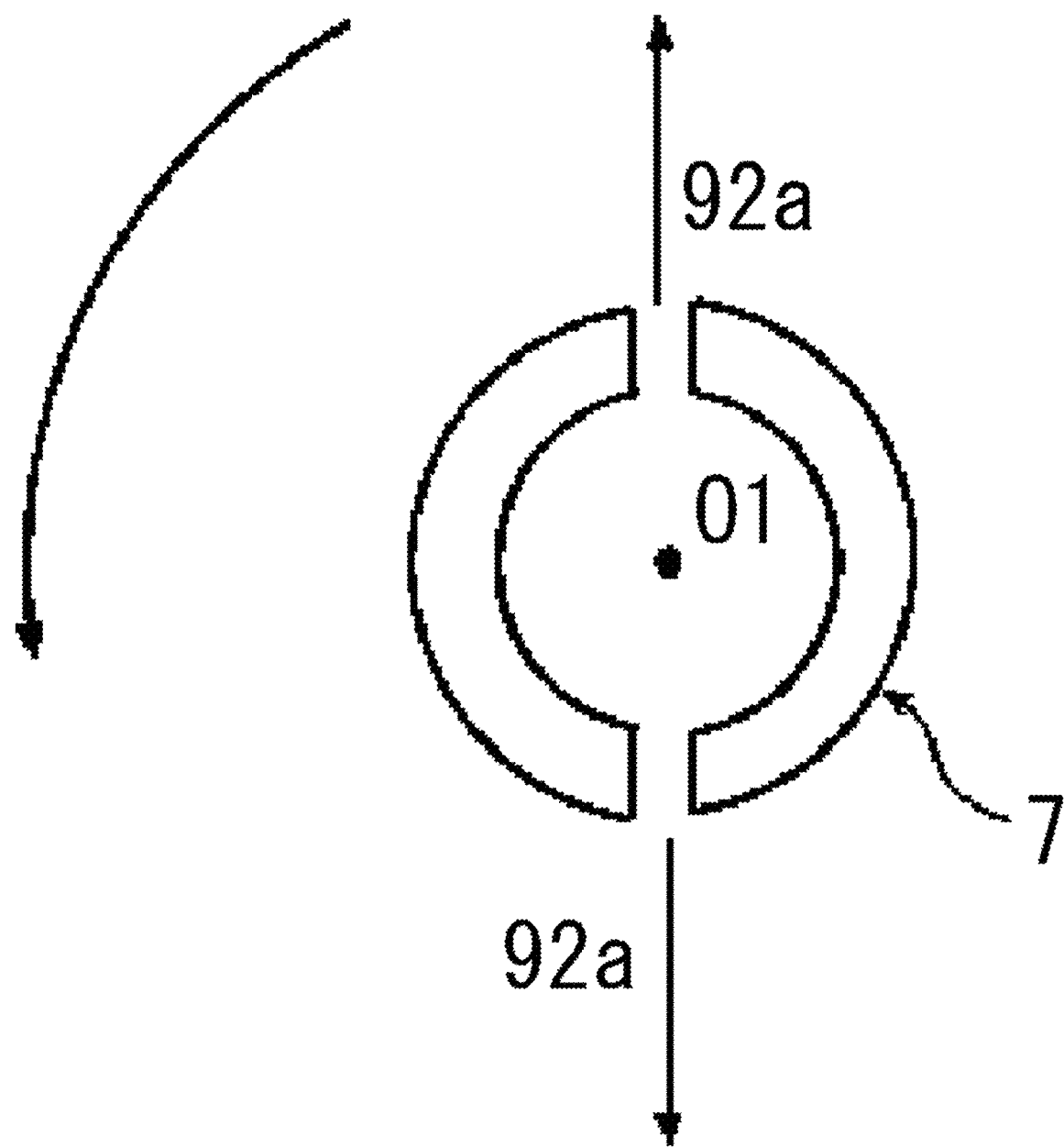
FIG. 10B is a schematic cross-sectional view of gas nozzles of the chemical vapor deposition system (CVD furnace) for formation of a hard film in Comparative Example 2.

In Comparative Example 2, a CVD furnace illustrated in FIGS. 10A and 10B was used for formation of a hard film. A configuration of this CVD furnace will be briefly described. In FIGS. 10A and 10B, the same components are denoted by the same reference numerals as those in FIGS. 9A and 9C. In the CVD furnace, a mixed gas is fed from a flow path 92 via nozzles 92a of the pipe 7 into the reaction container 5. Although the pipe 7 turns, the rotation mechanism of the pipe 7 is not depicted.

In Comparative Example 2, an intermediate film including titanium nitride was formed on a substrate as in Examples under the same conditions for formation of a film as those in Example 1. While gaseous $H_2$ was fed at 800° C., the pressure in the CVD furnace 1 was reduced to 1 kPa. Subsequently, mixed gases consisting of $H_2$, $N_2$, $CrCl_3$, and $AlCl_3$ or $NH_3$ and having a compositions in Table 2 were fed from a flow path 92 through nozzles 92a of the pipe 7 into the reaction container 5. An intermediate film on an insert substrate and a hard film, which included a nitride of Al and Cr and had a thickness of about 6 µm, on the intermediate film were formed by chemical vapor deposition, resulting in a coated cutting tool.

Figure 11A:
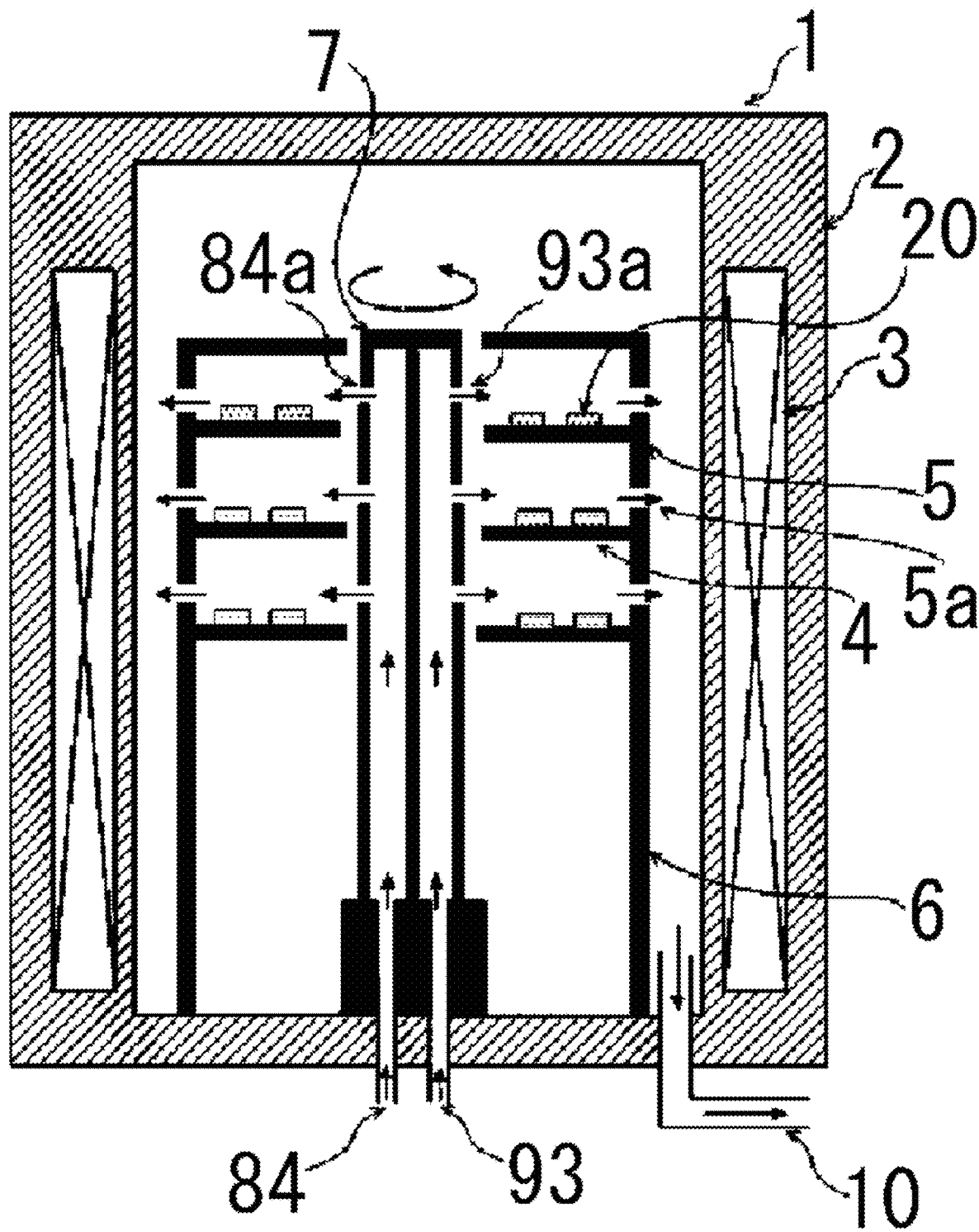
FIG. 11A is a schematic diagram of a chemical vapor deposition system (CVD furnace) for formation of hard films in Comparative Examples 3 and 4.
Figure 11B:
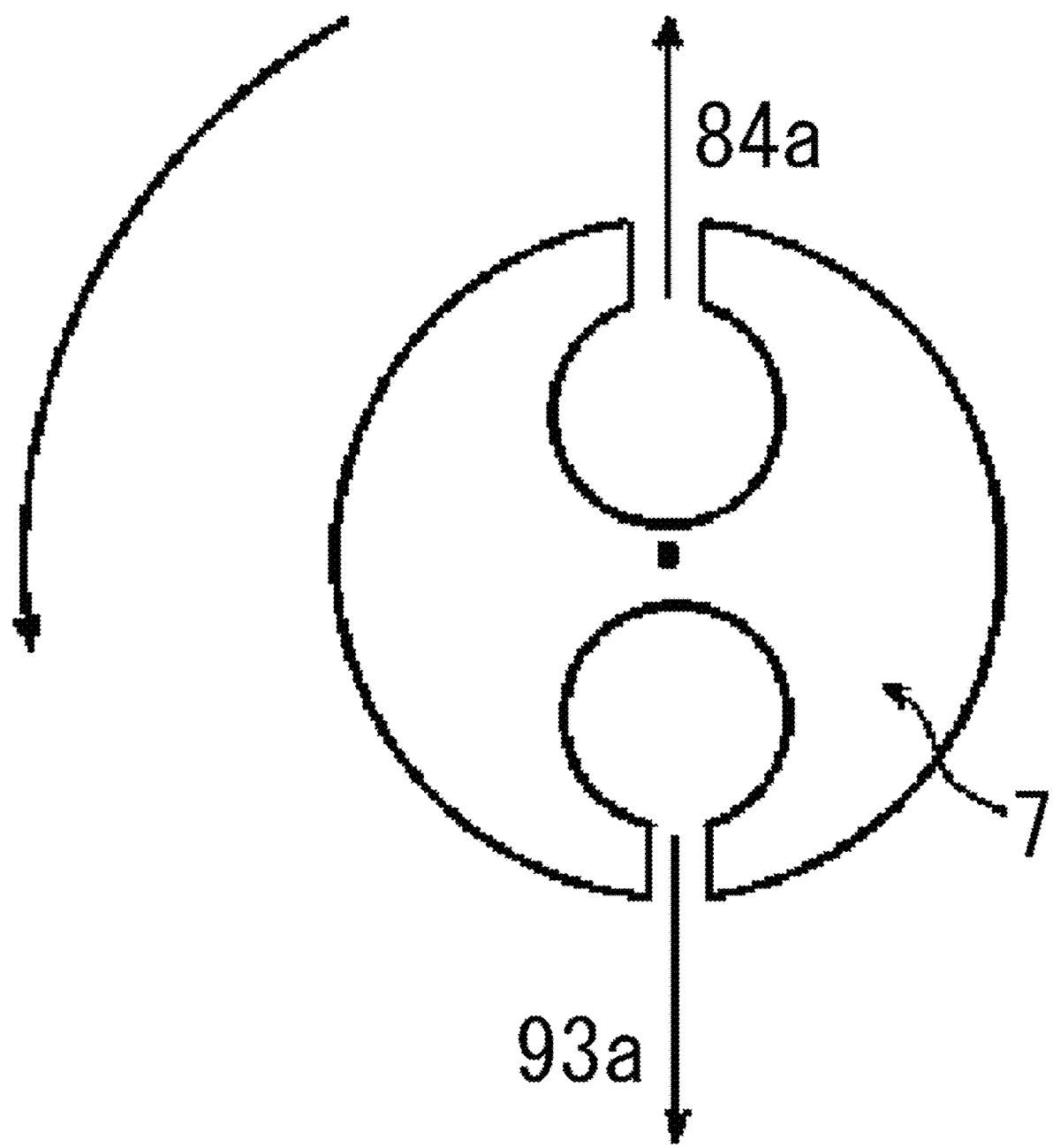
FIG. 11B is a schematic cross-sectional view of gas nozzles of the chemical vapor deposition system (CVD furnace) for formation of hard films in Comparative Examples 3 and 4.

In Comparative Example 3, a CVD furnace illustrated in FIGS. 11A and 11B was used for formation of a hard film. The configuration of this CVD furnace will be briefly described. In FIGS. 11A and 11B, the same components are denoted by the same reference numerals as those in FIGS. 9A and 9C. In the CVD furnace, a mixed gas from a flow path 84 and a mixed gas from a flow path 93 are respectively fed through nozzles 84a and nozzles 93a of the pipe 7 into the reaction container 5. Although pipe 7 can turn, the rotational mechanism of the pipe 7 is not depicted.

In Comparative Example 3, an intermediate film including titanium nitride was formed on a substrate as in Examples under the same conditions for formation of a film as those of Example 1. While gaseous $H_2$ was fed at 800° C., the pressure in the CVD furnace 1 was reduced to 4 kPa. Subsequently, a mixed gas A containing $H_2$, $N_2$, $CrCl_3$, and $AlCl_3$ and having a composition in Table 2 was fed from the flow path 84 through the nozzles 84a of the pipe 7 into the reaction container 5. A mixed gas B consisting of $H_2$, $N_2$, and $NH_3$ and having a composition in Table 2 was fed from the flow path 93 through the nozzles 93a of the pipe 7 into the reaction container 5. An intermediate film on an insert substrate and a hard film, which included a complex nitride of Al and Cr and had a thickness of about 6 µm, on the intermediate film were formed by chemical vapor deposition, resulting in a coated cutting tool.

In Comparative Example 4, the same CVD furnace as that in Comparative Example 3 was used for formation of a hard film. An intermediate film including titanium nitride was formed on a substrate as in Examples under the same conditions for formation of a film as those in Example 1. While gaseous $H_2$ was fed at 800° C., the pressure in the CVD furnace 1 was reduced to 4 kPa. Subsequently, a mixed gas A consisting of $H_2$, $N_2$, $CrCl_3$, and $AlCl_3$ and having a composition in Table 2 was fed from the flow path 84 through the nozzles 84a of the pipe 7 into the furnace. A mixed gas B consisting of $H_2$, $N_2$, and $NH_3$ and having a composition in Table 2 was fed from the flow path 93 through the nozzles 93a of the pipe 7 into the furnace. An intermediate film on an insert substrate and then a hard film, which included a complex nitride of Al and Cr and had a thickness of about 6 µm, on the intermediate film were formed by chemical vapor deposition, resulting in a coated cutting tool.

In Example 8, an upper layer was provided. After formation of the hard film including a complex nitride of Al and Cr in accordance with Examples, a bonding layer and an upper layer with an aluminum oxide film were sequentially formed on the hard film.

In order to form a bonding layer including a Ti(CN) film and a Ti(CNO) film, a mixed gas consisting of 63.5 vol % $H_2$, 22.0 vol % $N_2$, 3.2 vol % $CH_4$, and 1.3 vol % $TiCl_4$ was fed from the flow path 81 through the gas inlet of the preheating chamber 6 at 1000° C. under 16 kPa. The mixed gas was then fed into the preheating compartment 62. The mixed gas flowed into the reaction container through the first nozzles 83a and 83b of the pipe 7. 10 vol % $H_2$ was fed from the flow path 91 through the second nozzles 91a and 91b of the pipe 7 into the furnace, resulting in a Ti(CN) film having a thickness of 0.5 µm. Subsequently, another mixed gas consisting of 51.3 vol % $H_2$, 30.7 vol % $N_2$, 3.0 vol % $CH_4$, 1.2 vol % $TiCl_4$, 3.0 vol % CO, and 0.8 vol % $CO_2$ was fed into the preheating compartment 62 at 1000° C. under 16 kPa. The mixed gas flowed into the reaction container through the first nozzles 83a and 83b of the pipe 7. 10 vol % $H_2$ was fed from the flow path 91 through the second nozzles 91a and 91b of the pipe 7 into the furnace, resulting in a Ti(CNO) film having a thickness of 0.5 µm.

Another mixed gas consisting of 9.2 vol % $AlCl_3$, 85.3 vol % $H_2$, 4.3 vol % $CO_2$, 0.2 vol % $H_2S$, and 1.0 vol % HCl was fed into the preheating compartment 62 at 1000° C. under 9 kPa. The mixed gas flowed into the reaction container via the first nozzles 83a and 83b of the pipe 7. 10 vol % $H_2$ was fed from the flow path 9-91 through the second nozzles 91a and 91b of the pipe 7 into the furnace, resulting in an aluminum oxide film having a thickness of 1 µm.

In Comparative Example 5, an arc ion plating system was used for formation of a film. An intermediate film was not provided. An alloy target having a composition of $Al_{70}Cr_{30}$ (the numbers indicate an atomic ratio) was used. The negative biasing voltage of −100 V was applied to a substrate. Gaseous nitrogen was fed into the furnace at 500° C. under 3 Pa. A film including a complex nitride of Al and Cr and having a thickness of about 3 µm was formed, resulting in a coated cutting tool.

TABLE 1

| | Intermediate Film | | | |
|---|---|---|---|---|
| Category | Temperature (° C.) | Pressure (kPa) | Type | Thickness (µm) |
| Ex. 1 | 800 | 12 | TiN | 0.2 |
| Ex. 2 | 800 | 12 | TiN | 0.3 |
| Ex. 3 | 800 | 12 | TiN | 0.6 |
| Ex. 4 | 800 | 12 | TiN | 0.1 |
| Ex. 5 | 800 | 12 | TiN | 0.3 |
| Ex. 6 | 800 | 12 | TiAlN | 4.2 |
| Ex. 7 | 750 | 12 | TiN | 0.3 |
| Ex. 8 | 800 | 12 | TiN | 0.3 |
| Comp. Ex. 1 | 800 | 12 | TiN | 0.3 |
| Comp. Ex. 2 | 800 | 12 | TiN | 0.3 |
| Comp. Ex. 3 | 800 | 12 | TiN | 0.3 |
| Comp. Ex. 4 | 800 | 12 | TiN | 0.3 |
| Comp. Ex. 5 | — | — | — | — |

Notes:
"—" indicates that the intermediate film is not provided.

TABLE 2

| | | | AlCrN Film | | | | | | | | |
|---|---|---|---|---|---|---|---|---|---|---|---|
| | | | Partial Pressure (vol. %) | | | | | | | | |
| | | | Mixed Gas A | | | | | Mixed Gas B | | | |
| | | | Mixed Gas a1 | | Mixed Gas a2 | | | | | NH$_3$/ | NH$_3$/ |
| Category | Temperature (° C.) | Pressure (kPa) | H$_2$ | Chromium Chloride | H$_2$ | N$_2$ | AlCl$_3$ | H$_2$ | N$_2$ | NH$_3$ | (H$_2$ + N$_2$) | (AlCl$_3$ + CrCl$_3$) |
| Ex. 1 | 800 | 4 | 31.65 | 0.84 | 22.79 | 6.33 | 0.10 | 12.66 | 25.32 | 0.32 | 0.008 | 0.33 |
| Ex. 2 | 800 | 4 | 37.31 | 0.50 | 35.82 | 3.73 | 0.06 | 7.46 | 14.03 | 0.19 | 0.008 | 0.33 |
| Ex. 3 | 800 | 4 | 30.85 | 0.82 | 16.04 | 14.81 | 0.14 | 12.34 | 24.68 | 0.31 | 0.008 | 0.32 |
| Ex. 4 | 800 | 4 | 38.17 | 0.51 | 9.92 | 28.24 | 0.06 | 7.63 | 15.27 | 0.19 | 0.008 | 0.33 |
| Ex. 5 | 800 | 4 | 30.49 | 0.81 | 31.71 | 0.00 | 0.10 | 12.20 | 24.39 | 0.30 | 0.008 | 0.33 |
| Ex. 6 | 800 | 4 | 31.12 | 2.07 | 22.41 | 6.22 | 0.21 | 12.45 | 24.90 | 0.62 | 0.017 | 0.27 |
| Ex. 7 | 800 | 4 | 31.65 | 0.84 | 22.79 | 6.33 | 0.10 | 12.66 | 25.32 | 0.32 | 0.008 | 0.33 |
| Ex. 8 | 800 | 4 | 31.65 | 0.84 | 22.79 | 6.33 | 0.10 | 12.66 | 25.32 | 0.32 | 0.008 | 0.33 |
| Comp. Ex. 1 | 800 | 4 | 31.41 | 0.84 | 22.62 | 6.28 | 0.21 | 12.57 | 25.13 | 0.94 | 0.025 | 0.90 |
| Comp. Ex. 2 | 800 | 4 | 85.70 | 0.20 | — | 12.50 | 0.60 | — | — | 1.00 | — | 1.25 |
| Comp. Ex. 3 | 800 | 4 | 29.70 | 0.20 | — | 12.50 | 0.60 | 55.00 | 1.00 | 1.00 | 0.018 | 1.25 |
| Comp. Ex. 4 | 800 | 4 | 29.40 | 0.20 | — | 12.50 | 0.90 | 55.00 | 1.00 | 1.00 | 0.018 | 0.91 |

Note 1:
The total volume of the mixed gases A and B is 100 vol. %.

Note 2:
"—" represents "not contained".

With Examples 1 to 8 and Comparative Examples 1 to 5, compositions and crystal structures of hard films were determined and cutting performances were evaluated as follows:

«Composition of Hard Film»

Characteristic X-rays were measured at five lateral points in the central region across the thickness of each hard film provided on the insert substrate (SNMN120408) for evaluation of physical properties in a cross-section with an electron probe micro analyzer (EPMA, JXA-8500F available from JEOL Ltd.) under the conditions of an accelerating voltage of 10 kV, a probe current of 0.05 A, and a beam diameter of 0.5 µm. The composition of the hard film including a complex nitride of aluminum and chromium was determined from the average of the five measurements. The results are shown in Table 3.

«Determination of Crystal Structure»

An X-ray diffractometer (EMPYREAN available from PANalytical) was used. A hard film on a rake face of the insert (SNMN120408) for evaluation of physical properties was irradiate with CuKα$_1$ rays (wavelength λ: 0.15405 nm) at a tube voltage of 45 kV and a tube current of 40 mA to evaluate the crystal structure of the hard film.

Diffraction peaks were assigned with reference to the ICDD X-ray diffraction database. Since the ICDD database does not contain data of a hard film including a complex nitride of aluminum and chromium and having an fcc structure, aluminum nitride having an fcc structure in ICDD File was referenced instead.

The ratios TC (311) of X-ray diffraction intensities were determined by the following expression (Exp. 2) from the observed x-ray diffraction pattern.

$$TC(311) = \{I(311)/Io(311)\}/[\Sigma\{I(hkl)/Io(hkl)\}/8] \quad \text{(Exp.2)}$$

I(hkl): the observed X-ray diffraction intensity assigned to each crystal plane (hkl) of a complex nitride of aluminum and chromium in the hard film Io(hkl): the standard X-ray diffraction intensity assigned to the corresponding crystal plane (hkl) of aluminum nitride listed in File No. 00-025-1495 available from ICDD Σ represents the sum of the observed X-ray diffraction intensities assigned to eight crystal planes (111), (200), (220), (311), (222), (400), (331), and (420)

The results are shown in Table 3.

«Evaluation of Cutting Performance»

Each coated milling insert was mounted to an edge-replaceable rotary cutting tool (ASRT5063R-4) with a locking screw. The lifetime of each hard film on the cutting tool was evaluated under the following milling conditions: The wear loss of the hard film on a flank face of the insert was observed by 100× optical microscopy. A five-minute cutting process followed by observation of the wear loss was repeated. When a wear loss of the hard film on the flank face exceeded 0.350 mm, the cumulative cutting time was defined as the lifetime of the hard film. The conditions for the process are described below. The results of the test are shown in Table 3.

Material to be cut: S55C (30HRC)

Mode of process: milling

Type of insert: WDNW140520

Cutting rate: 150 m/min

Number of rotation: 758 rounds/min

Feeding length per tooth: 2.05 mm/tooth

Feeding rate: 1554 mm/min

Milled depth in axial direction: 1.0 mm

Milled depth in radial direction: 40 mm

Mode of cutting: dry cutting

TABLE 3

| Category | Crystal Structure | Structure | Composition (Al$_x$Cr$_y$)N (atom %) x | y | TC (311) | Mean Width (μm) | TB/TA | Lifetime (min) |
|---|---|---|---|---|---|---|---|---|
| Ex. 1 | Columnar | fcc | 80 | 20 | 2.36 | 0.5 | 0.067 | 150 |
| Ex. 2 | Columnar | fcc | 85 | 15 | 2.00 | 0.1 | 0.060 | 140 |
| Ex. 3 | Columnar | fcc + hcp | 90 | 10 | 1.35 | 1.5 | 0.044 | 100 |
| Ex. 4 | Columnar | fcc | 70 | 30 | 2.08 | 0.8 | 0.072 | 130 |
| Ex. 5 | Columnar | fcc | 83 | 17 | 2.36 | 0.3 | 0.073 | 130 |
| Ex. 6 | Columnar | fcc | 60 | 40 | 1.30 | 2.0 | 0.050 | 90 |
| Ex. 7 | Columnar | fcc | 72 | 28 | 2.04 | 1.0 | 0.062 | 120 |
| Ex. 8 | Columnar | fcc | 78 | 22 | 2.12 | 0.6 | 0.066 | 140 |
| Comp. Ex. 1 | Granular | fcc + hcp | 92 | 8 | 0.91 | — | 0.024 | 50 |
| Comp. Ex. 2 | Granular | hcp + fcc | 71 | 29 | 0.12 | — | — | 20 |
| Comp. Ex. 3 | Columnar | fcc | 74 | 26 | 0.52 | 2.5 | — | 40 |
| Comp. Ex. 4 | Columnar | fcc + hcp | 95 | 5 | 0.26 | 2.3 | — | 45 |
| Comp. Ex. 5 | Columnar | fcc | 65 | 35 | 0.95 | 0.1 | 0.040 | 40 |

Note:
"—" represents "not observed".

Figure 1B:
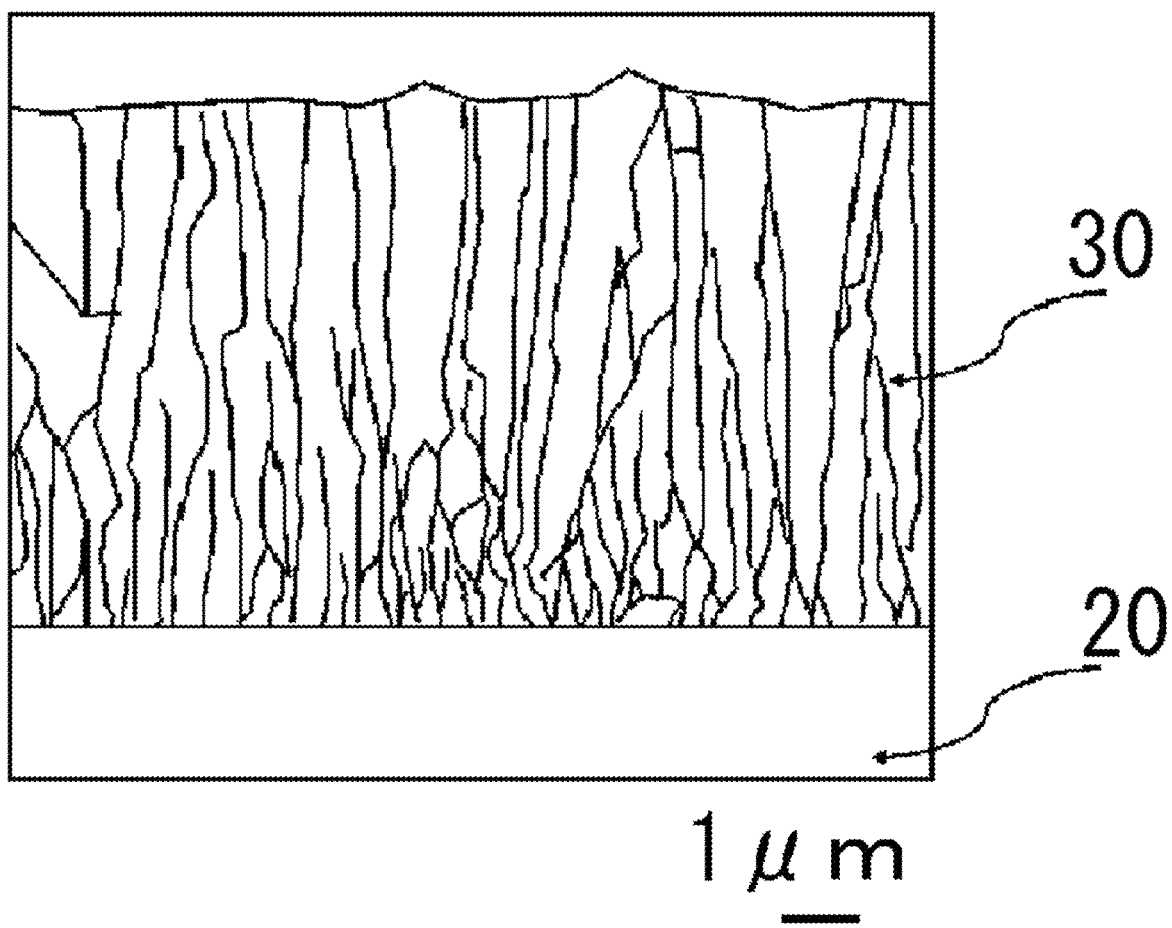
FIG. 1B is a schematic diagrammatic view of the photograph in FIG. 1A.
Figure 1C:
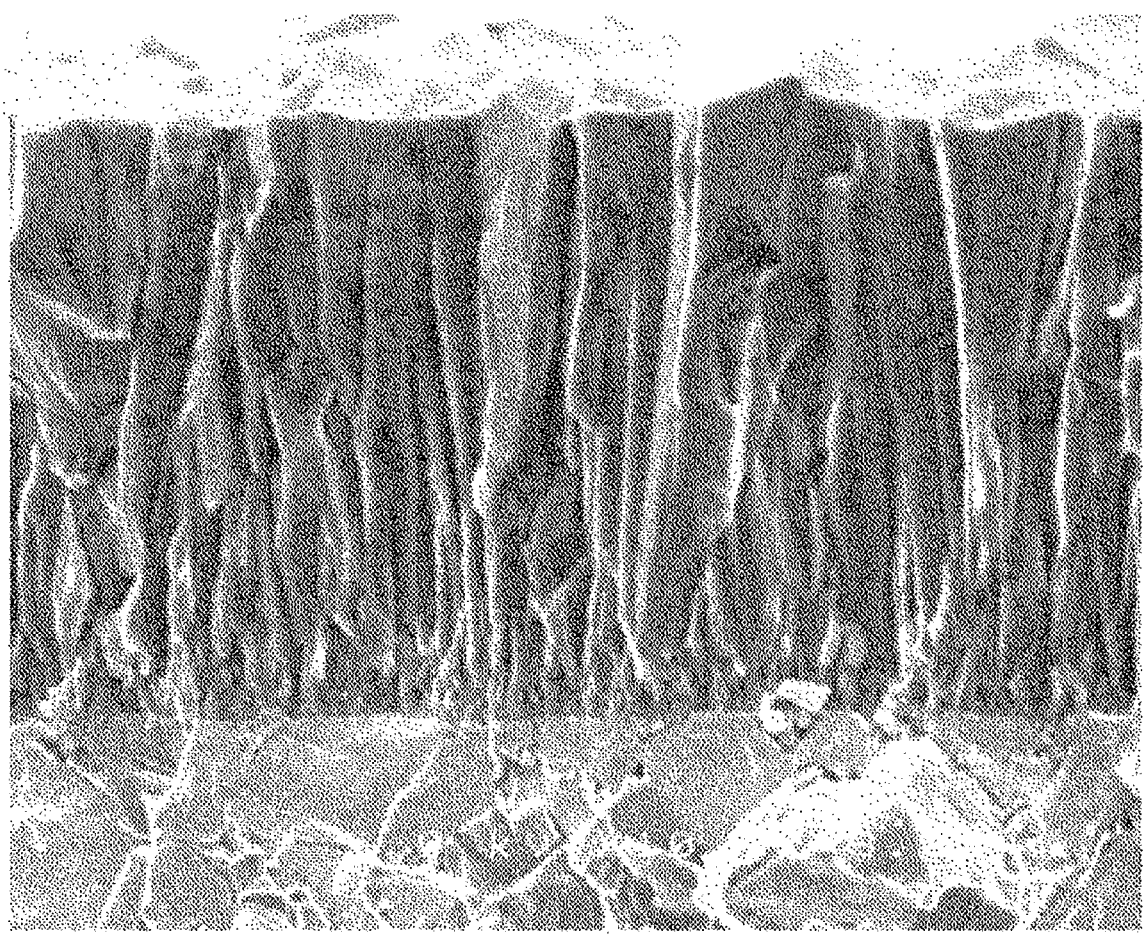
FIG. 1C is a photograph, substituted for drawing, generated by dithering of the photograph in FIG. 1A.

FIGS. 1A and 1C each show a photograph of a SEM image (10,000×) of a rake face of the insert (SNMN120408) for evaluation of physical properties in accordance with Example 1. FIG. 1B shows a schematic diagrammatic view of the photograph. FIGS. 1A, 1B, and 1C demonstrate that Example 1 includes aggregates of columnar grains grown on the substrate along the thickness of the hard film. The micro structure of the hard film will be detailed below.

Figure 8:
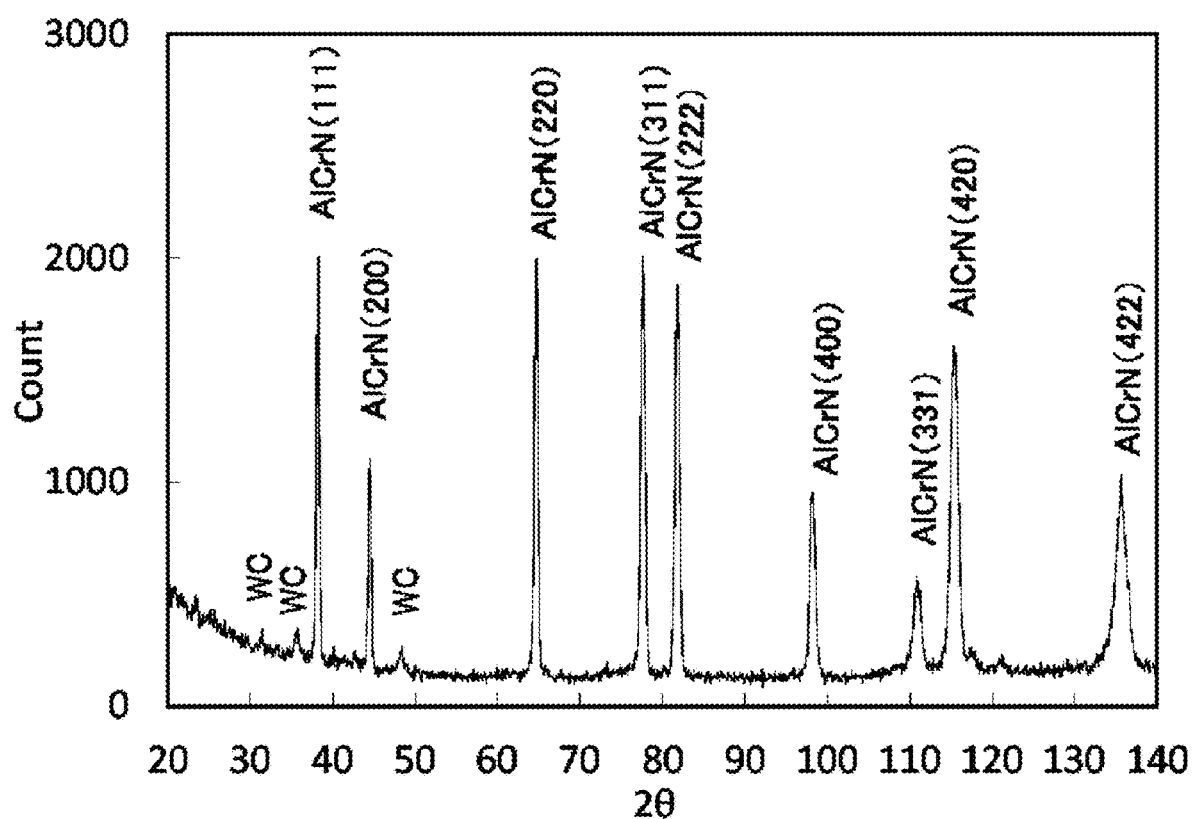
FIG. 8 shows an X-ray diffraction pattern in Example 1.

FIG. 8 illustrates an X-ray diffraction pattern of Example 1. In this X-ray diffraction pattern, the diffraction peak of WC in the WC-based cemented carbide substrate and the diffraction peak of a complex nitride including aluminum and chromium, having an fcc structure, and contained in the hard film are observed. The X-ray diffraction pattern in FIG. 8 demonstrate that the complex nitride of aluminum and chromium and contained in the hard film of Example 1 has only an fcc structure. The ratio TC (hkl), determined from the x-ray diffraction pattern in FIG. 8, of each X-ray diffraction intensity are shown in Table 4. The ratios TC (hkl) of the X-ray diffraction intensities assigned to planes (hkl) in Examples 2 and 3 are shown in Tables 5 and 6, respectively. Since the ratio TC (422) of the X-ray diffraction intensity cannot be determined, it is denoted by "-" in Tables 4 to 6.

As illustrated in Tables 4 to 6, the ratio TC (311) of the X-ray diffraction intensity in Example 1 is the highest among the ratios TC of the X-ray diffraction intensities. The results demonstrate the longer lifetime of the tool in Example 1 than those of the tools in other Examples. In contrast, the ratio TC (311) of the X-ray diffraction intensity in Comparative Example 1 is not the highest among the ratios TC of the X-ray diffraction intensities, as shown in Table 7. Since the ratio TC (422) of the X-ray diffraction intensity cannot be determined, it is denoted by "-" in Table 7.

TABLE 4

| AlCrN Plane Index | Spacing d (Å) | Diffraction Angle 2θ (°) | Peak Intensity | TC (hkl) |
|---|---|---|---|---|
| I (111) | 2.356 | 38.21 | 1808 | 1.50 |
| I (200) | 2.036 | 44.50 | 947 | 0.21 |
| I (220) | 1.441 | 64.70 | 1866 | 0.69 |
| I (311) | 1.230 | 77.59 | 1847 | 2.36 |
| I (222) | 1.178 | 81.79 | 1705 | 1.67 |
| I (400) | 1.020 | 98.17 | 782 | 1.00 |
| I (331) | 0.936 | 110.88 | 378 | 0.33 |
| I (420) | 0.912 | 115.34 | 1379 | 0.23 |
| I (422) | 0.833 | 135.64 | 772 | — |

TABLE 5

| AlCrN Plane Index | Spacing d (Å) | Diffraction Angle 2θ (°) | Peak Intensity | TC (hkl) |
|---|---|---|---|---|
| I (111) | 2.354 | 38.24 | 2377 | 2.01 |
| I (200) | 2.036 | 44.51 | 1373 | 0.31 |
| I (220) | 1.440 | 64.73 | 1915 | 0.72 |
| I (311) | 1.230 | 77.66 | 1537 | 2.00 |
| I (222) | 1.178 | 81.80 | 1487 | 1.48 |
| I (400) | 1.019 | 98.27 | 735 | 0.96 |
| I (331) | 0.936 | 110.90 | 371 | 0.33 |
| I (420) | 0.913 | 115.30 | 1174 | 0.20 |
| I (422) | 0.831 | 135.90 | 699 | — |

TABLE 6

| AlCrN Plane Index | Spacing d (Å) | Diffraction Angle 2θ (°) | Peak Intensity | TC (hkl) |
|---|---|---|---|---|
| I (111) | 2.351 | 38.29 | 4247 | 2.34 |
| I (200) | 2.032 | 44.60 | 7524 | 1.11 |
| I (220) | 1.438 | 64.84 | 6449 | 1.58 |
| I (311) | 1.226 | 77.91 | 1590 | 1.35 |
| I (222) | 1.174 | 82.07 | 1033 | 0.67 |
| I (400) | 1.016 | 98.66 | 572 | 0.49 |
| I (331) | 0.933 | 111.50 | 491 | 0.29 |
| I (420) | 0.910 | 115.06 | 1642 | 0.18 |
| I (422) | 0.831 | 136.25 | 1075 | — |

TABLE 7

| AlCrN Plane Index | Spacing d (Å) | Diffraction Angle 2θ (°) | Peak Intensity | TC (hkl) |
|---|---|---|---|---|
| I (111) | 2.355 | 38.21 | 3607 | 3.47 |
| I (200) | 2.035 | 44.52 | 4917 | 1.26 |
| I (220) | 1.440 | 64.73 | 2860 | 1.22 |
| I (311) | 1.230 | 77.58 | 615 | 0.91 |
| I (222) | 1.176 | 81.93 | 364 | 0.41 |
| I (400) | 1.017 | 98.55 | 227 | 0.34 |
| I (331) | 0.934 | 111.22 | 264 | 0.27 |

TABLE 7-continued

| AlCrN Plane Index | Spacing d (Å) | Diffraction Angle 2θ (°) | Peak Intensity | TC (hkl) |
|---|---|---|---|---|
| I (420) | 0.908 | 116.18 | 635 | 0.12 |
| I (422) | 0.829 | 136.74 | 335 | — |

Examples 1 to 8 had enhanced wear resistance and enhanced resistance to chipping and exhibited high durability. In contrast, Comparative Examples 1 to 5 caused chipping of the hard film in an early stage. In Comparative Examples exhibiting low durability, the ratio TC (311) of the X-ray diffraction intensity was less than 1.00. In contrast, the hard films of Examples exhibiting high durability had fine structures including aggregates of fine columnar grains and had a ratio TC (311) of the X-ray diffraction intensity of 1.30 or more. Among Examples, those exhibiting a ratio TC (311) of the X-ray diffraction intensity of 2.00 or more have particularly high durability. As the ratio TB/TA increases, the durability also increases.

A hard film of Example 1 will now be described. FIGS. 2A and 2C each show a photograph of a TEM image (200,000×) of the hard film of Example 1. FIG. 2B shows a schematic diagrammatic view of the photograph.

As illustrated in FIGS. 2A, 2B, and FIG. 2C, the hard film of Example 1 contains crystal grains consisting of multi-player structures and monolayer structures.

Figure 3A:
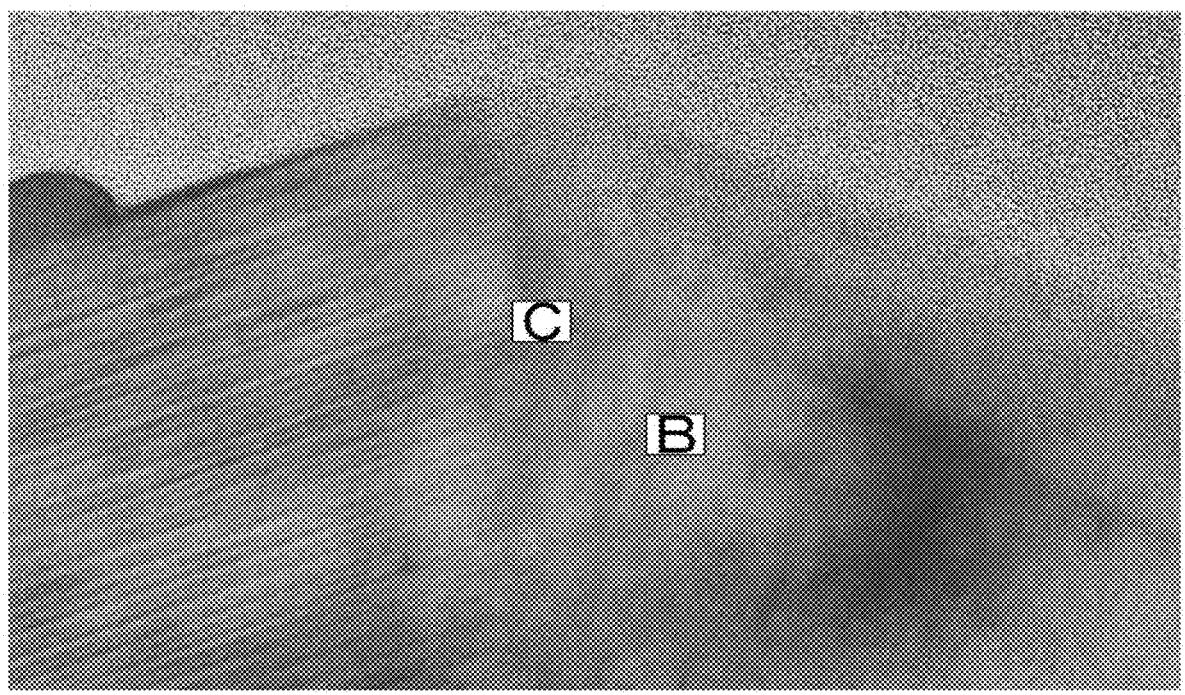
FIG. 3A is a photograph (magnification: 2,000,000×), substituted for drawing, of an enlarged TEM image of a portion A in FIG. 2.
Figure 3B:
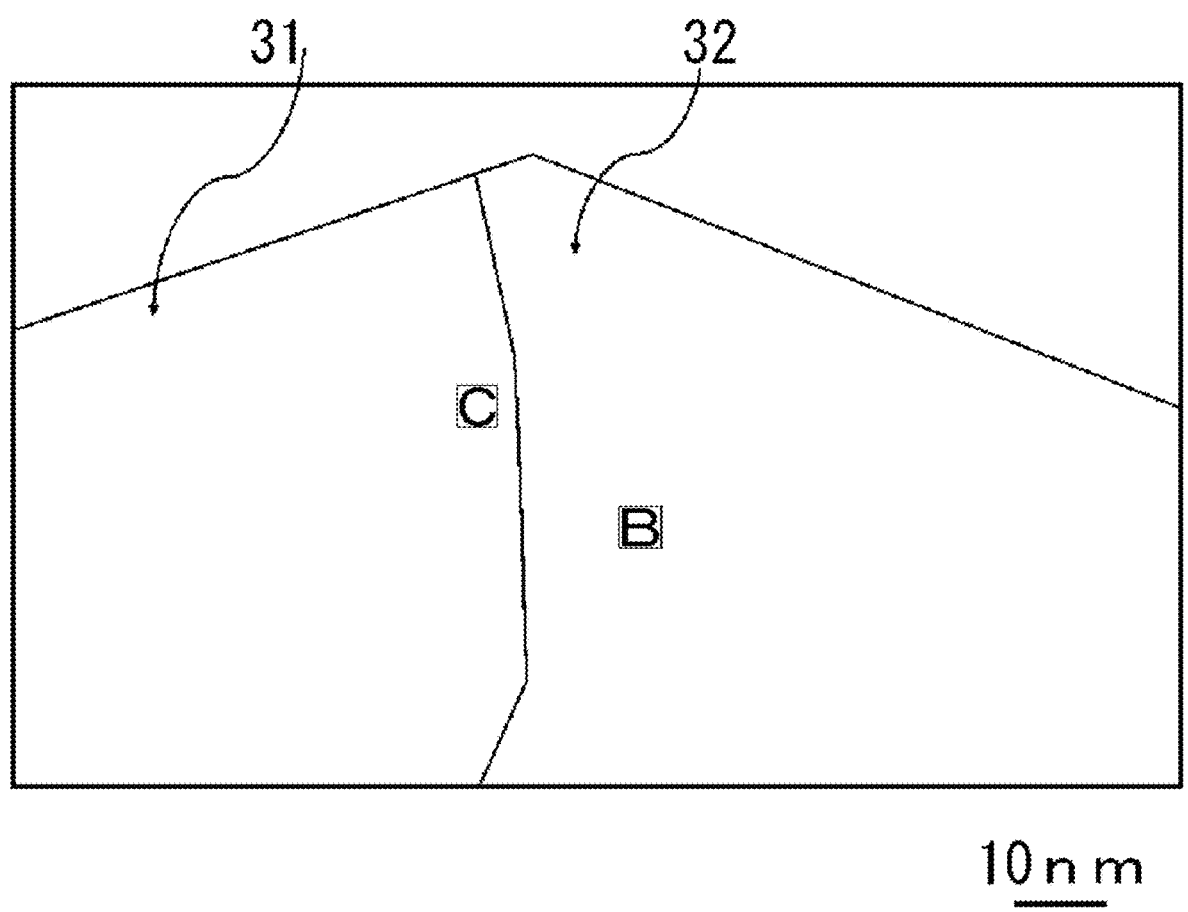
FIG. 3B is a schematic diagrammatic view of the photograph in FIG. 3A.
Figure 3C:
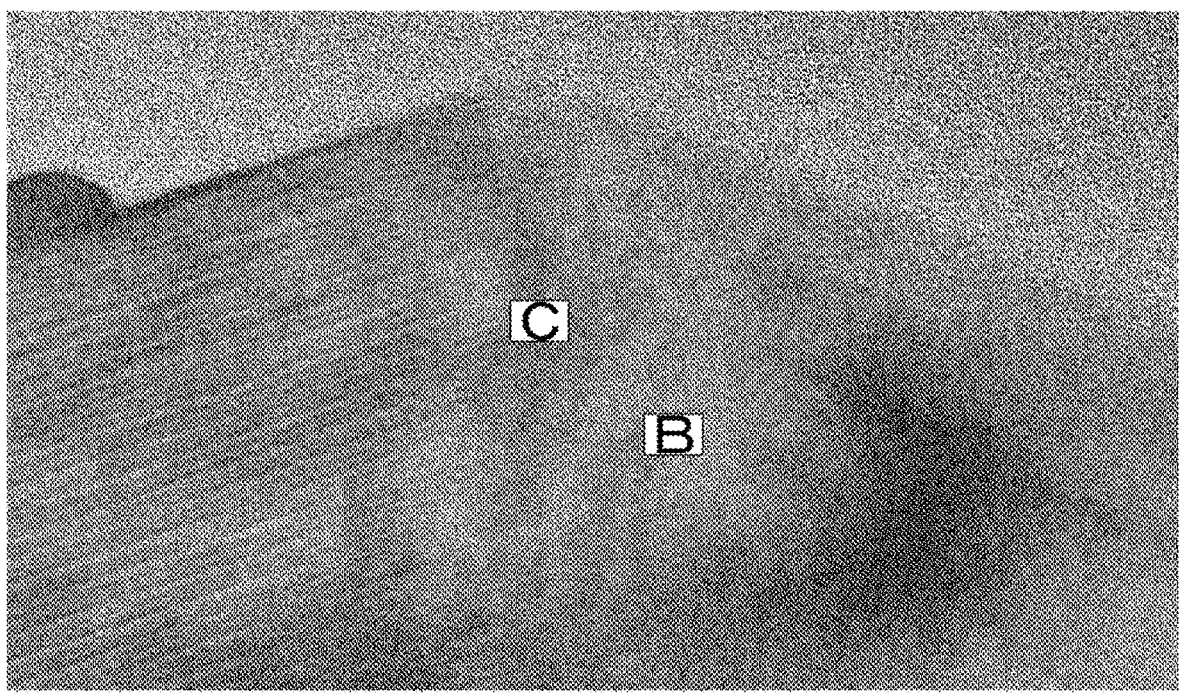
FIG. 3C is a photograph, substituted for drawing, generated by dithering of the photograph in FIG. 3A.

FIGS. 3A and 3C each show a photograph of an enlarged TEM image (2,000,000×) of a portion A in FIGS. 2A and 2C. FIG. 3B shows a schematic diagrammatic view of the photograph. As illustrated in FIGS. 3A and 3B, the hard film of Example 1 contains crystal grains consisting of multilayer structures and monolayer structures also in a micro structure observed in a higher magnification.

Figure 4A:
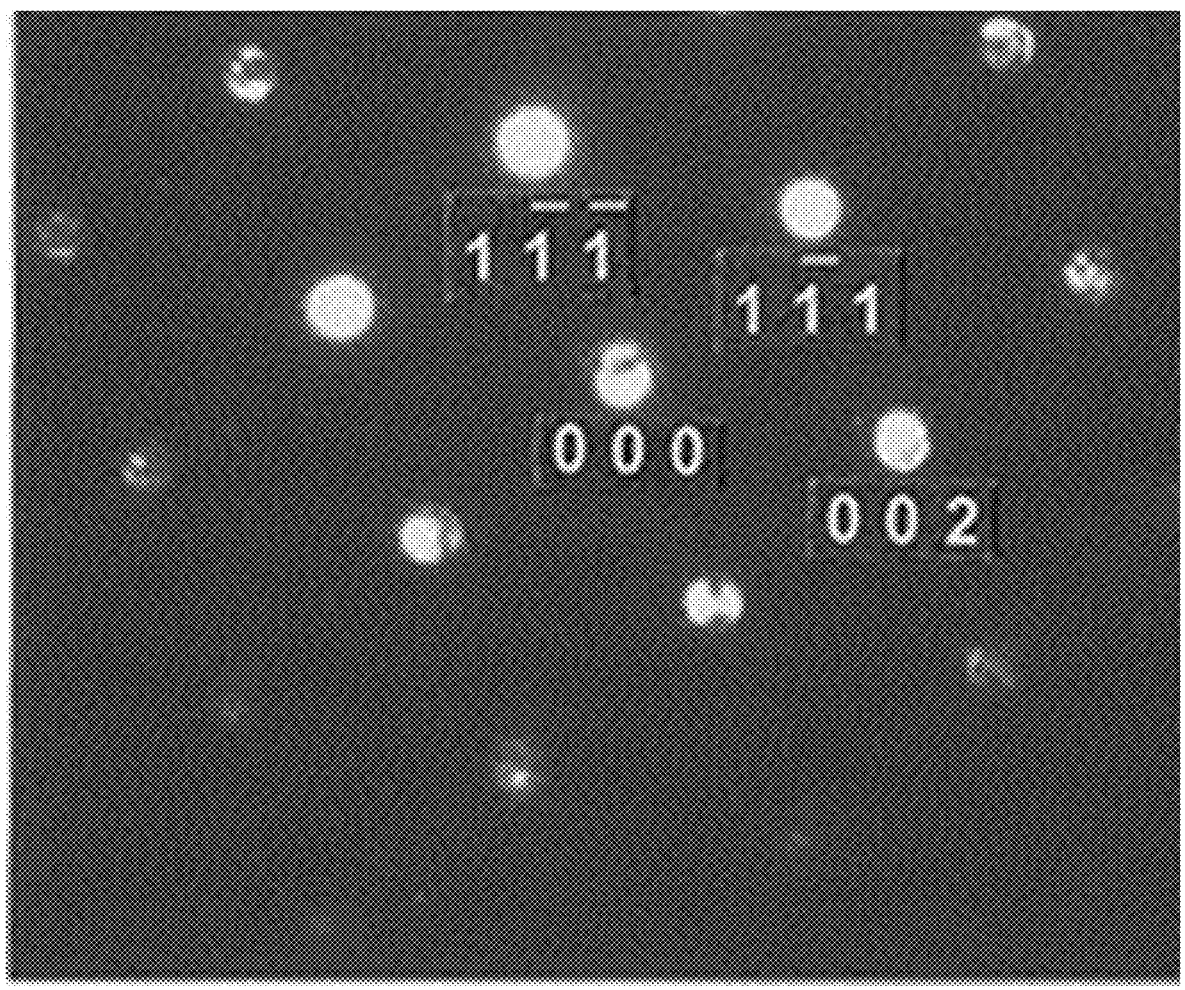
FIG. 4A is a photograph, substituted for drawing, indicating a nanobeam diffraction pattern in a portion B of the photograph in FIG. 3A.
Figure 4B:
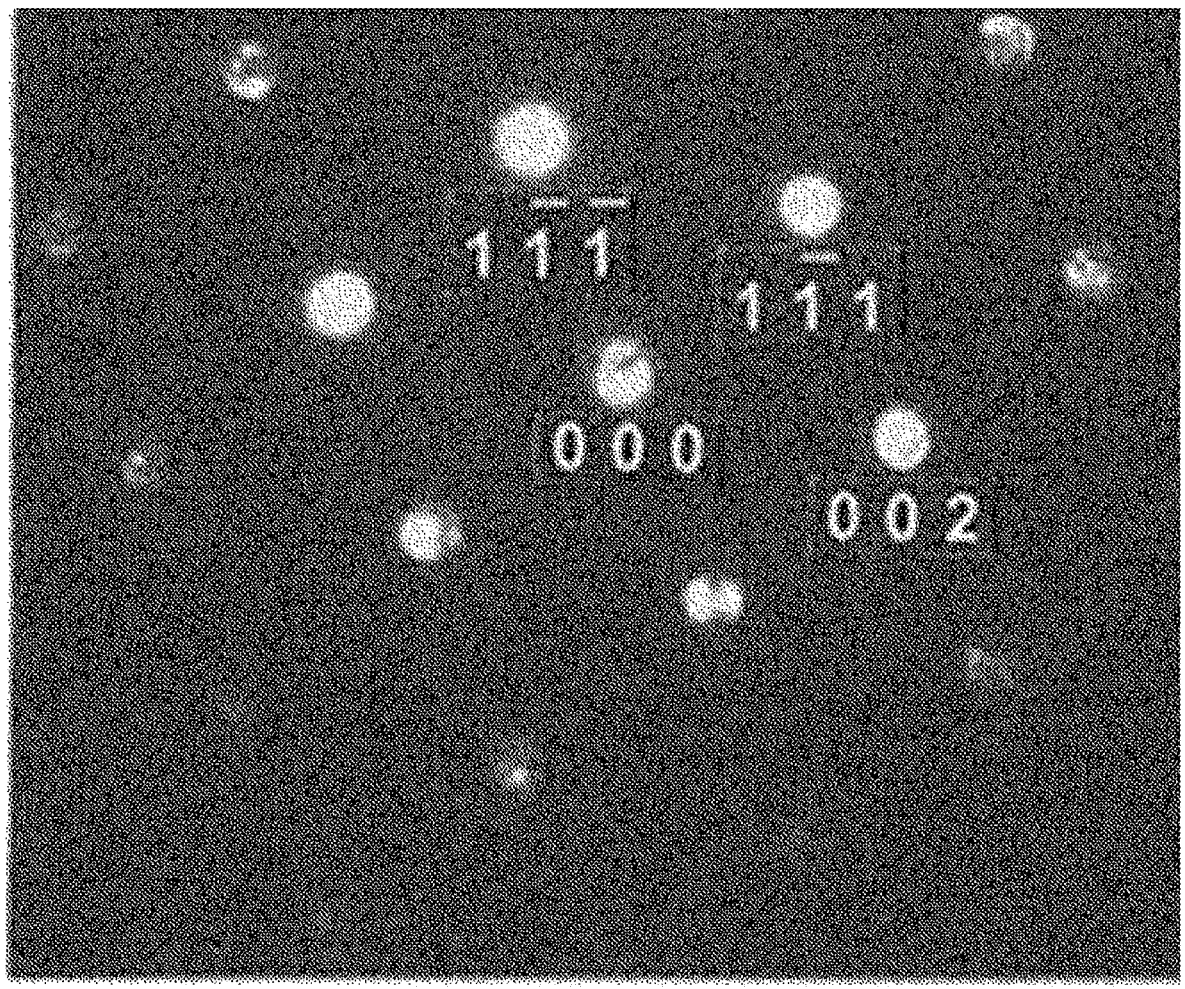
FIG. 4B is a photograph, substituted for drawing, generated by dithering of the photograph in FIG. 4A.

FIGS. 4A and 4B each show a nanobeam diffraction pattern of a portion B (consisting of a monolayer structure) in FIGS. 3A and 3C. As illustrated in FIGS. 4A and 4B, crystal grains consisting of monolayer structures in this portion have an fcc structure.

Figure 5A:
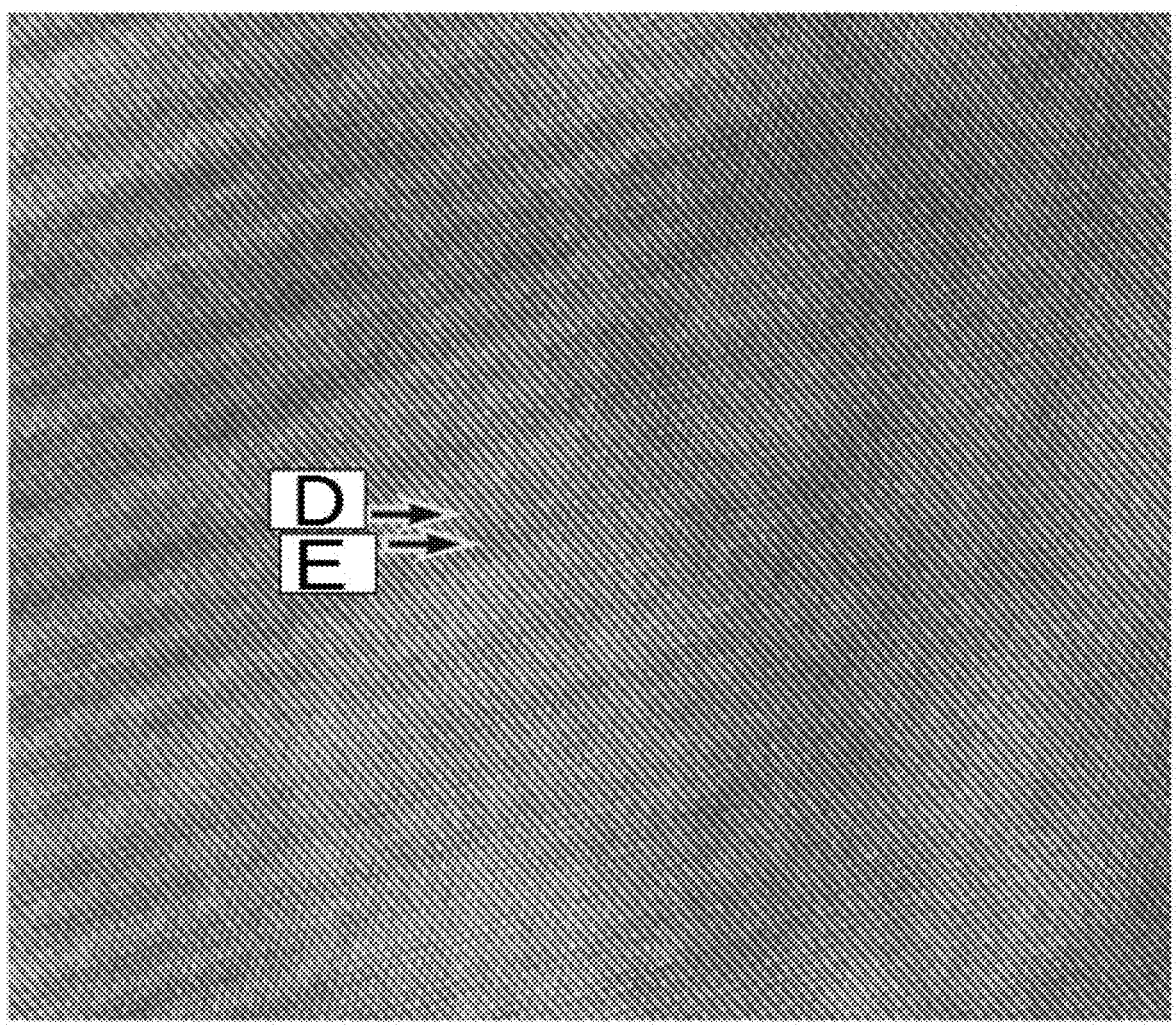
FIG. 5A is a photograph (magnification: 4,000,000×), substituted for drawing, of an enlarged TEM image of a portion C of the photograph in FIG. 3A.
Figure 5B:
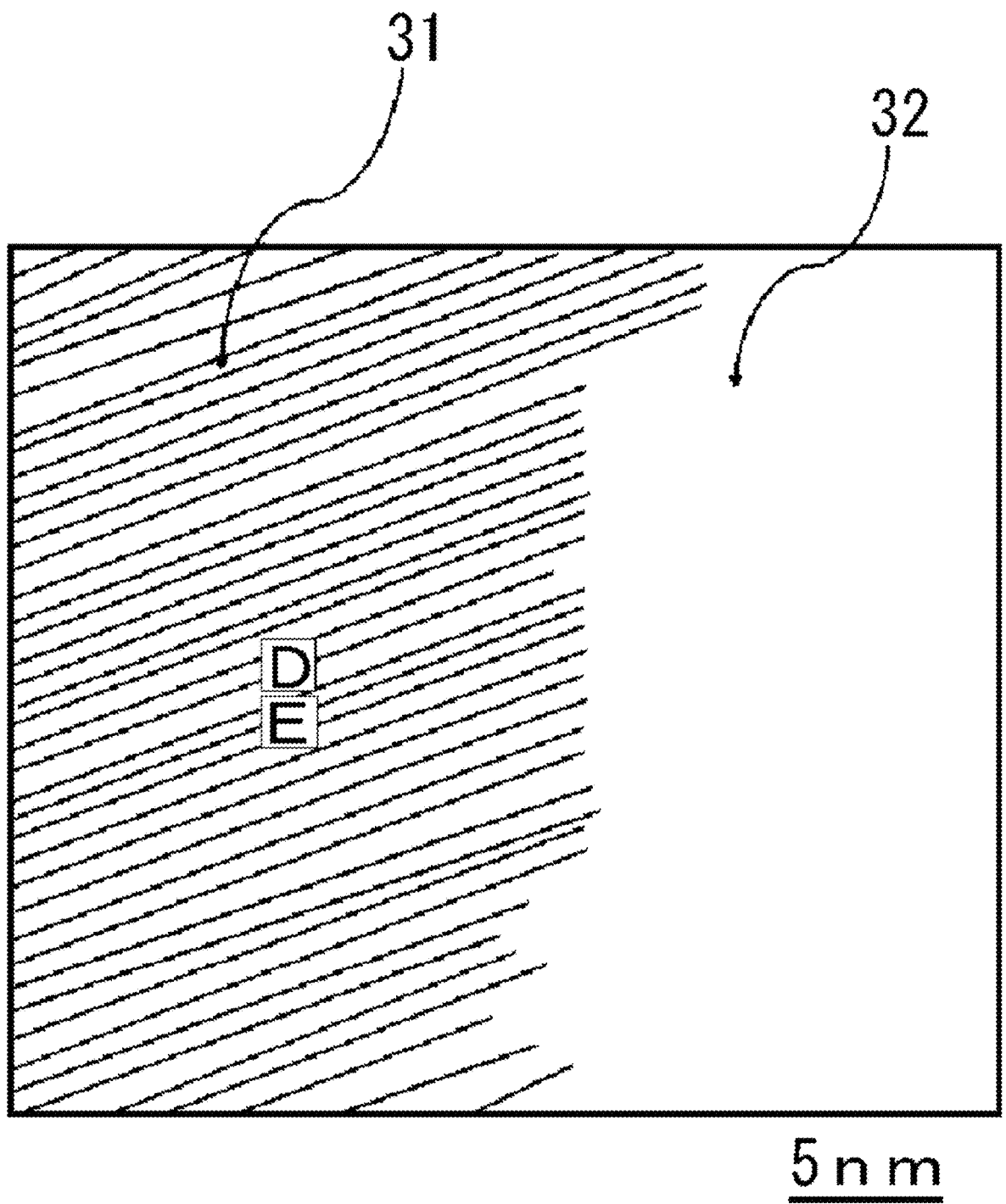
FIG. 5B is a schematic diagrammatic view of the photograph in FIG. 5A.
Figure 5C:
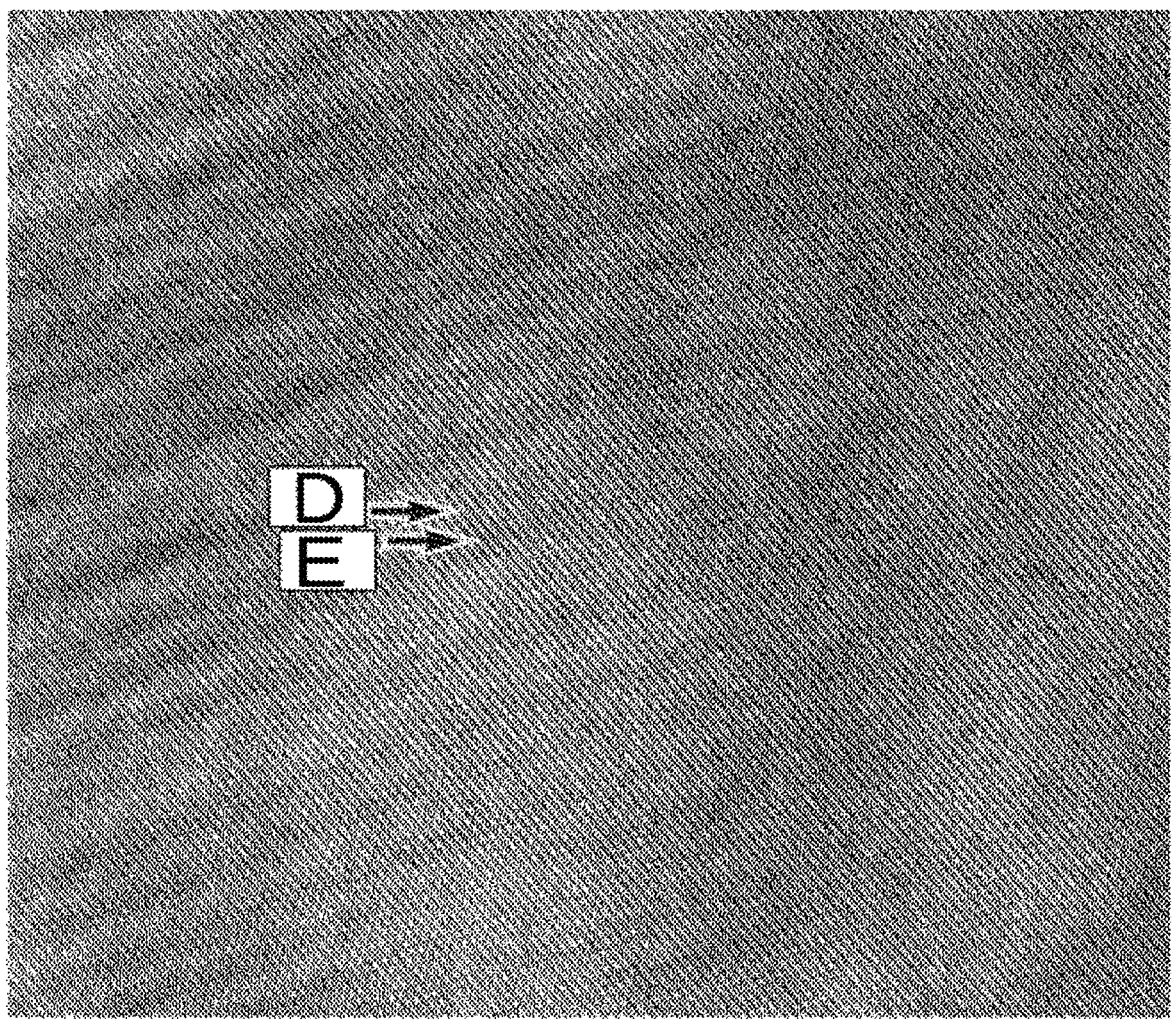
FIG. 5C is a photograph, substituted for drawing, generated by dithering of the photograph in FIG. 5A.

FIGS. 5A and 5C each show a photograph of an enlarged TEM image (4,000,000×) of a portion C (consisting of a multilayer structure) in FIGS. 3A and 3C. FIG. 5B shows a schematic diagrammatic view of the photograph. A relatively dark phase indicates a complex nitride including Al and Cr and having a relatively high Al content. A relatively light phase indicates a complex nitride including Al and Cr and having a relatively low Al content.

Figure 6A:
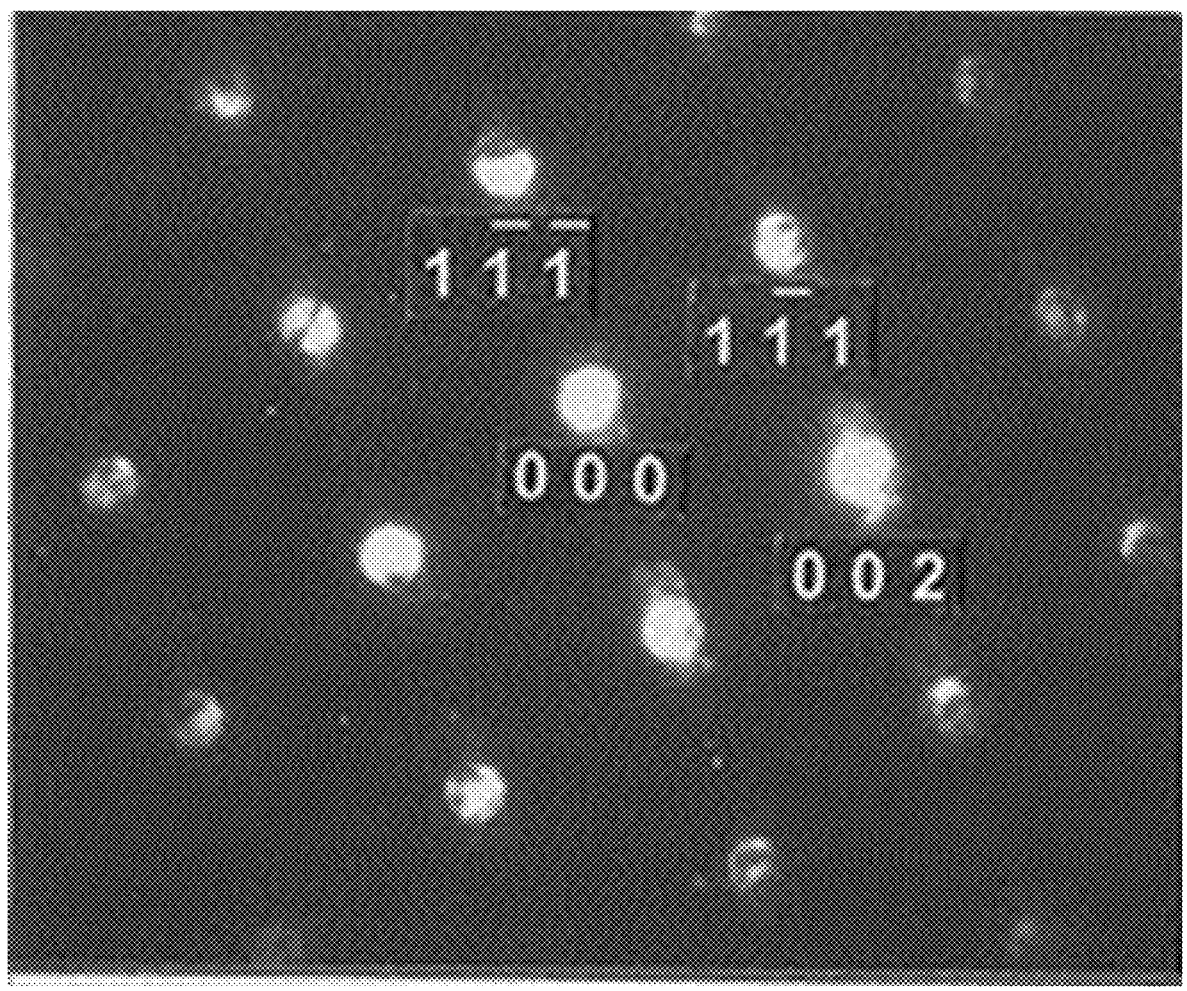
FIG. 6A is a photograph, substituted for drawing, indicating a nanobeam diffraction pattern in a portion D of the photograph in FIG. 5A.
Figure 6B:
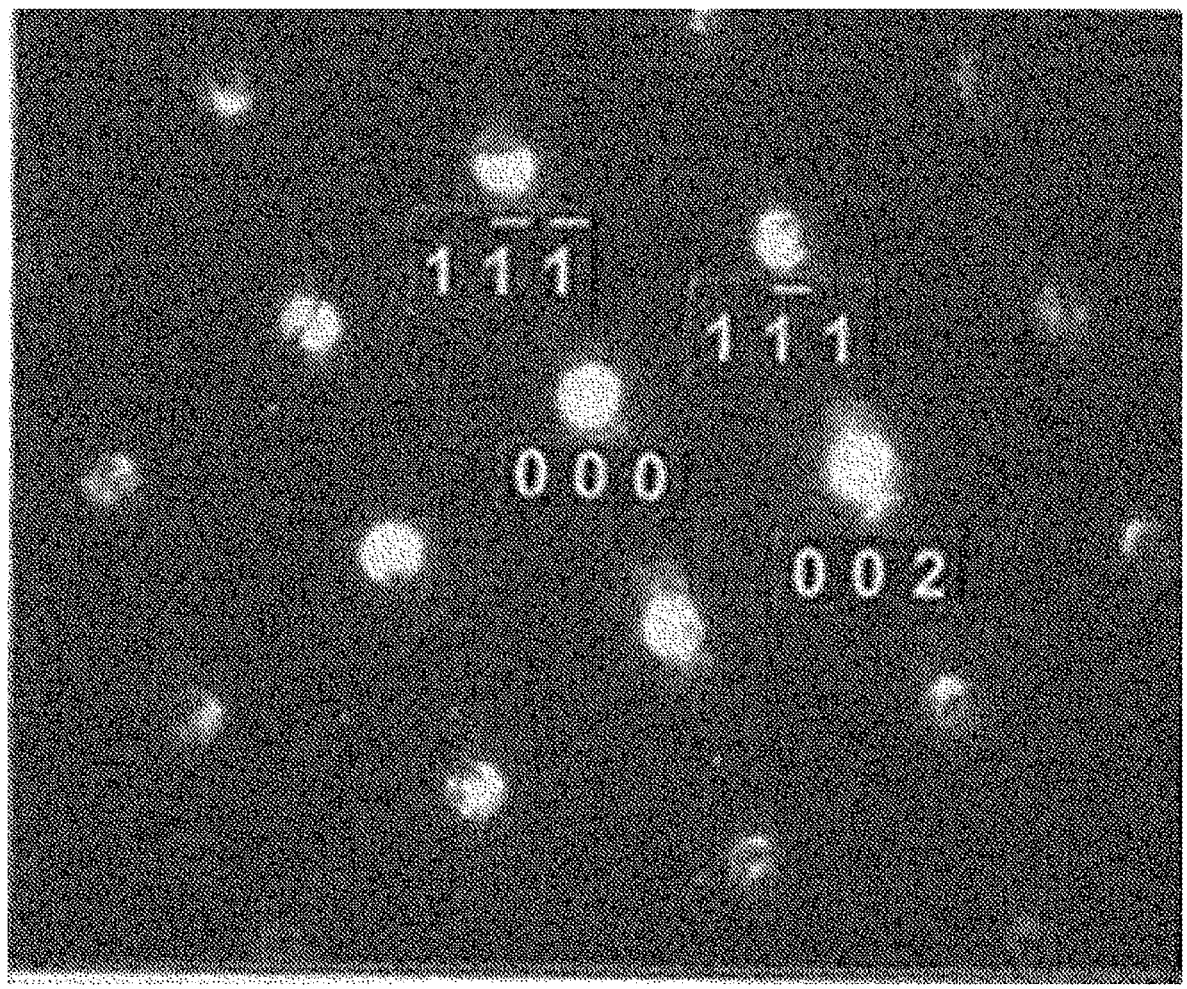
FIG. 6B is a photograph, substituted for drawing, generated by dithering of the photograph in FIG. 6A.
Figure 7A:
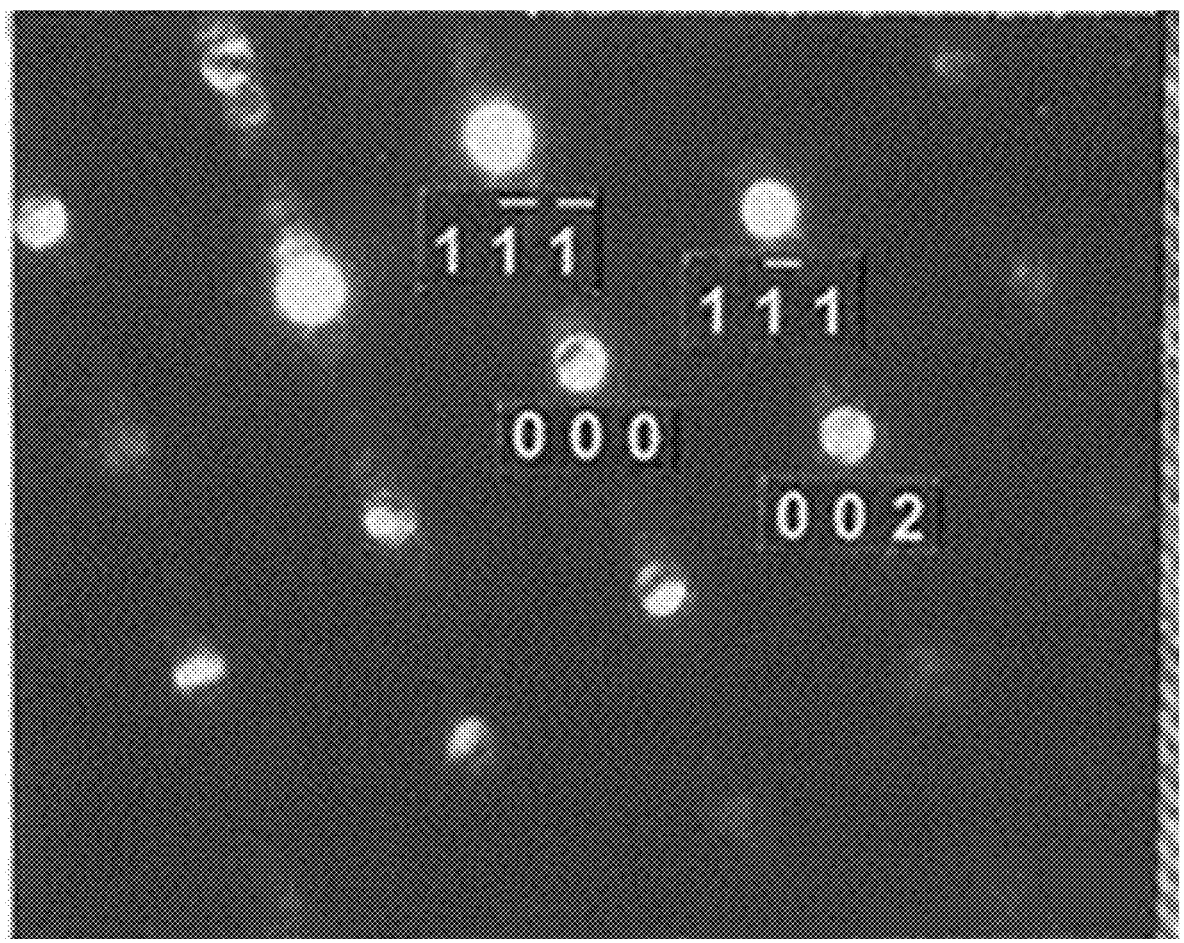
FIG. 7A is a photograph, substituted for drawing, indicating a nanobeam diffraction pattern in a portion E of the photograph in FIG. 5A.
Figure 7B:
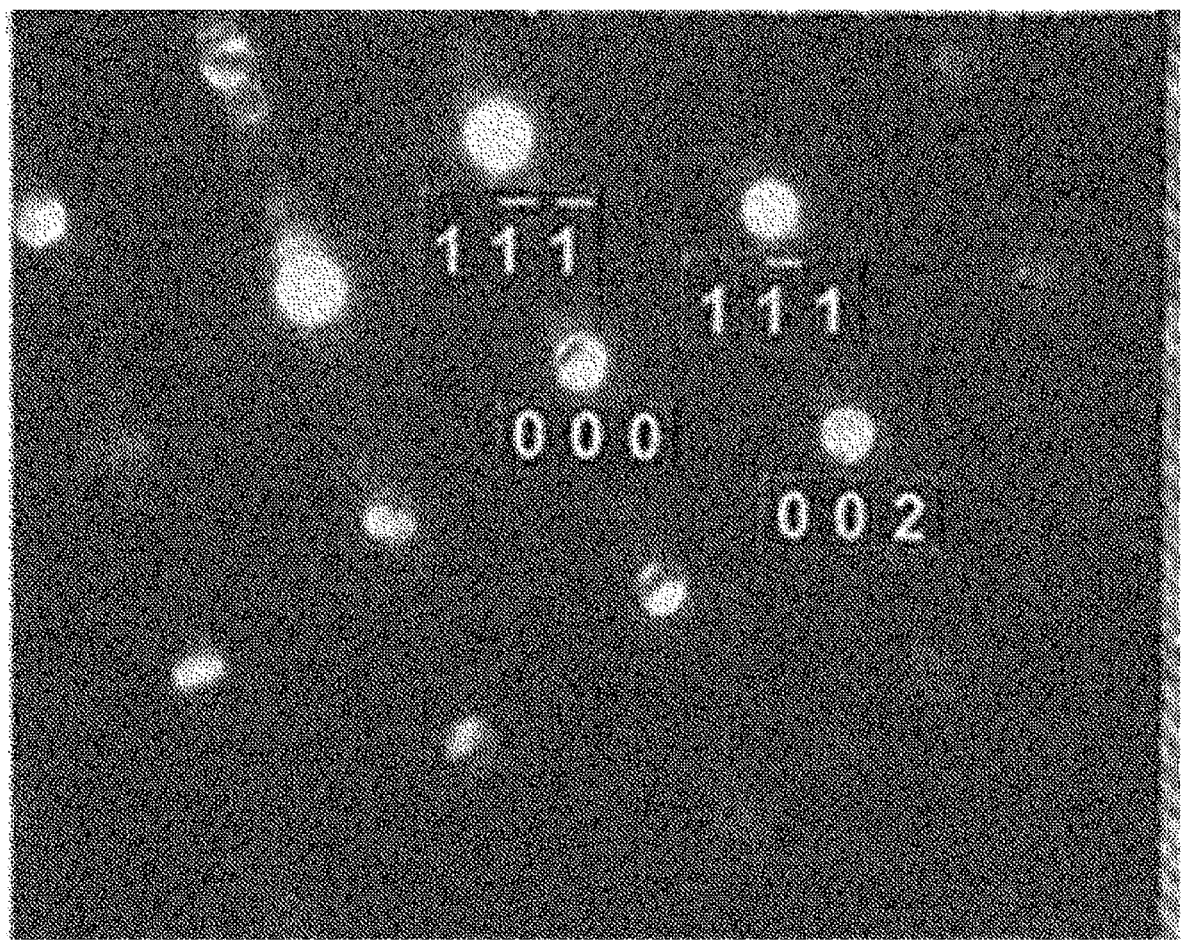
FIG. 7B is a photograph, substituted for drawing, generated by dithering of the photograph in FIG. 7A.

FIGS. 6A and 6B each show a nanobeam diffraction pattern of a portion D (consisting of a multilayer structure) in FIGS. 5A and 5C. FIGS. 7A and 7B each show a nanobeam diffraction pattern of a portion E (consisting of a multilayer structure) in FIGS. 5A and 5C. As illustrated in FIGS. 6A and 6B and FIGS. 7A and 7B, crystal grains consisting of multilayer structures in each layer also have an fcc structure.

In the monolayer structure, the complex nitride of Al and Cr has an Al content of 60 atom % or more and 90 atom % or less. In the multilayer structure, the complex nitride of Al and Cr having a relatively high Al content has an Al content of 60 atom % or more and 95 atom % or less. The complex nitride of Al and Cr having a relatively low Al content has an Al content of 20 atom % or more and 50 atom % or less. The crystal grains consisting of multilayered structures as a whole have a lower Al content than the crystal grains consisting of monolayer structures.

In the micro structure of the hard film according to Example 1 of the present invention, crystal grains including complex nitride of Al and Cr with a relatively high Al content and consisting of monolayer structures and crystal grains including complex nitride of Al and Cr with a relatively low Al content and consisting of multilayer structures were dispersed.

The embodiment disclosed above is illustrative only and non-limiting in every respect. The scope of the present invention is determined by Claims, not by the embodiment and is intended to include any variation in an equivalent sense and scope of Claims.

REFERENCE SIGNS LIST

1: CHEMICAL VAPOR DEPOSITION SYSTEM (CVD FURNACE)
2: CHAMBER
3: HEATER
4: INSERT SHELF
5: REACTION CONTAINER
5a: APERTURES OF REACTION CONTAINER
6: PREHEATING CHAMBER (PREHEATER)
61: PREHEATING COMPARTMENT
62: GASEOUS CHROMIUM CHLORIDE GENERATING COMPARTMENT
63: MIXING COMPARTMENT
7: PIPE (GAS DISCHARGER)
83a, 83b, 91a, 91b, 92a, 93a: GAS NOZZLES
81: FLOW PATH FOR MIXED GAS a2
82: FLOW PATH FOR MIXED GAS GENERATING MIXED GAS a1
84: FLOW PATH FOR MIXED GAS
91: FLOW PATH FOR MIXED GAS B
92: FLOW PATH FOR MIXED GAS
93: FLOW PATH FOR MIXED GAS
10: EXHAUST PIPE
11: FLOW PATH CONNECTION
12: MECHANISM TURNABLE DURING FORMATION OF FILM
13a: FLOW PATH FOR MIXED GAS B IN PREHEATING CHAMBER
13b: FLOW PATH (IN VERTICAL DIRECTION) FOR MIXED GAS B IN FLOW PATH CONNECTION
13c: FLOW PATH (AROUND ROTATION AXIS) FOR MIXED GAS B IN FLOW PATH CONNECTION
20: INSERT SUBSTRATE
30: HARD FILM (AlCrN FILM)
31: MULTILAYER STRUCTURE
32: MONOLAYER STRUCTURE
40: EMBEDDING RESIN FOR TEM OBSERVATION

The invention claimed is:
1. A coated cutting tool comprising:
a substrate; and
a hard film coated on the substrate, wherein
the hard film comprises aggregates of columnar grains grown on the substrate along the thickness of the film,
the hard film comprises a complex nitride of Al and Cr, the nitride having an Al content of 60 atom % or more and 90 atom % or less, a Cr content of 10 atom % or more, and a total content of Al and Cr of 90 atom % or more relative to the total amount of metal and metalloid elements;
the complex nitride in the hard film primarily has an fcc structure, one of nine peaks assigned to crystal planes (111), (200), (220), (311), (222), (400), (331), (420), and (422) of the fcc structure exhibiting the highest intensity in X-ray diffractometry, and the hard film has a ratio TC (311) of an X-ray diffraction intensity of 1.30 or more, wherein the ratio TC (311) is determined by an expression:

TC (311)={I(311)/Io(311)}/[Σ(I(hkl)/Io(hkl)}/8] wherein

I(hkl) is an observed X-ray diffraction intensity assigned to each crystal plane (hkl) of the complex nitride, Io(hkl) is the standard X-ray diffraction intensity assigned to the corresponding crystal plane (hkl) of the aluminum nitride listed in File No. 00-025-1495 available from International Center for Diffraction Data (ICDD), Σ represents the sum of the observed X-ray diffraction intensities assigned to eight crystal planes (111), (200), (220), (311), (222), (400), (331), and (420).

2. The coated cutting tool according to claim 1, wherein the ratio TC (311) of the X-ray diffraction intensity is 2.00 or more.

3. The coated cutting according to claim 1, wherein the ratio TC (311) of the X-ray diffraction intensity is higher than the ratios TC (hkl) assigned to crystal planes (111), (200), (220), (311), (222), (400), (331), and (420).

4. The coated cutting tool according to claim 1, wherein the ratios TC (420) and TC (200) of the X-ray diffraction intensities are each 1.00 .

5. The coated cutting tool according to claim 1, wherein the hard film satisfies a ratio TB/TA of 0.050 or more in the X-ray diffractometry, wherein TA represents the total peak intensity assigned to the crystal planes of the fcc structure and TB represents the peak intensity assigned to the crystal plane (422).

6. The coated cutting tool according to claim 1, wherein the columnar grains each have an average width of 0.1 μm or more and 2.0 μm or less at 0.5 μm from the surface of the hard film.

7. The coated cutting tool according to claim 1, wherein the hard film comprises dispersed crystal grains in a micro structure observed by transmission electron microscopy, the crystal grains each having a monolayer structure with a relatively high Al content and a multilayer structure with a relatively low Al content.

8. The coated cutting tool according to claim 1, further comprising an intermediate film between the substrate and the hard film.

9. The coated cutting tool according to claim 1, further comprising an upper layer on the hard film.

10. The coated cutting according to claim 2, wherein the ratio TC (311) of the X-ray diffraction intensity is higher than the ratios TC (hkl) assigned to crystal planes (111), (200), (220), (222), (400), (331), and (420).

* * * * *